US011139797B2

(12) United States Patent
Bower et al.

(10) Patent No.: US 11,139,797 B2
(45) Date of Patent: Oct. 5, 2021

(54) MICRO-TRANSFER-PRINTED ACOUSTIC WAVE FILTER DEVICE

(71) Applicant: X-Celeprint Limited, Dublin (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 196 days.

(21) Appl. No.: 16/226,805

(22) Filed: Dec. 20, 2018

(65) Prior Publication Data

US 2019/0123719 A1    Apr. 25, 2019

Related U.S. Application Data

(63) Continuation of application No. 15/047,250, filed on Feb. 18, 2016, now Pat. No. 10,200,013.

(51) Int. Cl.
| | | |
|---|---|---|
| *H03H 9/64* | (2006.01) | |
| *H03H 9/54* | (2006.01) | |
| *H03H 9/05* | (2006.01) | |
| *H03H 9/02* | (2006.01) | |
| *H03H 9/56* | (2006.01) | |

(Continued)

(52) U.S. Cl.
CPC ............... *H03H 9/64* (2013.01); *H03H 3/02* (2013.01); *H03H 3/08* (2013.01); *H03H 9/02015* (2013.01); *H03H 9/02543* (2013.01); *H03H 9/0509* (2013.01); *H03H 9/0585* (2013.01); *H03H 9/54* (2013.01); *H03H 9/564* (2013.01)

(58) Field of Classification Search
CPC .......... H03H 9/02015; H03H 9/02543; H03H 9/0509; H03H 9/0585; H03H 9/54; H03H 9/564; H03H 9/64; H03H 3/02; H03H 3/08; H01L 41/053; H01L 41/0815; H01L 41/22; H01L 41/31; H01L 27/20
USPC ............................... 333/186, 187, 189, 193
See application file for complete search history.

(56) References Cited

U.S. PATENT DOCUMENTS

| | | | |
|---|---|---|---|
| 4,642,508 A | * | 2/1987 | Suzuki ..................... H03H 3/04 310/321 |
| 5,313,177 A | | 5/1994 | Hickernell et al. |

(Continued)

FOREIGN PATENT DOCUMENTS

| | | |
|---|---|---|
| GB | 2 496 183 A | 5/2013 |
| JP | 2007-208845 A | 8/2007 |

(Continued)

OTHER PUBLICATIONS

Bower, C. A. et al., Transfer Printing: An Approach for Massively Parallel Assembly of Microscale Devices, IEEE, Electronic Components and Technology Conference, (2008).

(Continued)

*Primary Examiner* — Barbara Summons
(74) *Attorney, Agent, or Firm* — Choate, Hall & Stewart LLP; William R. Haulbrook; Michael D. Schmitt

(57) ABSTRACT

A compound acoustic wave filter device comprises a support substrate having an including two or more circuit connection pads. An acoustic wave filter includes a piezoelectric filter element and two or more electrodes. The acoustic wave filter is micro-transfer printed onto the support substrate. An electrical conductor electrically connects one or more of the circuit connection pads to one or more of the electrodes.

10 Claims, 19 Drawing Sheets

(51) Int. Cl.
*H03H 3/02* (2006.01)
*H03H 3/08* (2006.01)

(56) References Cited

U.S. PATENT DOCUMENTS

| | | | |
|---|---|---|---|
| 5,550,066 A | 8/1996 | Tang et al. |
| 5,621,555 A | 4/1997 | Park |
| 5,815,303 A | 9/1998 | Berlin |
| 5,872,493 A | 2/1999 | Ella |
| 5,994,722 A | 11/1999 | Averbeck et al. |
| 6,078,229 A | 6/2000 | Funada et al. |
| 6,084,579 A | 7/2000 | Hirano |
| 6,142,358 A | 11/2000 | Cohn et al. |
| 6,154,940 A | 12/2000 | Onishi et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,466,281 B1 | 10/2002 | Huang et al. |
| 6,566,981 B2 | 5/2003 | Urabe et al. |
| 6,577,367 B2 | 6/2003 | Kim |
| 6,627,966 B2 | 9/2003 | Jeong et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,911,708 B2 | 6/2005 | Park |
| 6,919,778 B2 | 7/2005 | Iwamoto et al. |
| 6,933,532 B2 | 8/2005 | Arnold et al. |
| 7,012,382 B2 | 3/2006 | Cheang et al. |
| 7,091,523 B2 | 8/2006 | Cok et al. |
| 7,098,589 B2 | 8/2006 | Erchak et al. |
| 7,109,828 B2 | 9/2006 | Takayama et al. |
| 7,129,457 B2 | 10/2006 | McElroy et al. |
| 7,195,733 B2 | 3/2007 | Rogers et al. |
| 7,199,683 B2 | 4/2007 | Thalhammer et al. |
| 7,288,753 B2 | 10/2007 | Cok |
| 7,307,369 B2 | 12/2007 | Yokota et al. |
| 7,368,034 B2 | 5/2008 | Ikeda et al. |
| 7,402,951 B2 | 7/2008 | Cok |
| 7,420,221 B2 | 9/2008 | Nagai |
| 7,423,501 B2 | 9/2008 | Kim et al. |
| 7,463,117 B2 | 12/2008 | Ohara et al. |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,982,364 B2 | 7/2011 | Takayama et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,058,768 B2 | 11/2011 | Milsom et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,558,243 B2 | 10/2013 | Bibl et al. |
| 8,618,721 B2 | 12/2013 | Ichikawa et al. |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,816,567 B2* | 8/2014 | Zuo ............... H03H 3/02 310/321 |
| 8,817,369 B2 | 8/2014 | Daiku |
| 8,835,940 B2 | 9/2014 | Hu et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,105,714 B2 | 8/2015 | Hu et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,358,775 B2 | 6/2016 | Bower et al. |
| 9,362,887 B2 | 6/2016 | Shealy |
| 9,367,094 B2 | 6/2016 | Bibl et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,601,356 B2 | 3/2017 | Bower et al. |
| 9,640,715 B2 | 5/2017 | Bower et al. |
| 9,761,754 B2 | 9/2017 | Bower et al. |
| 9,765,934 B2 | 9/2017 | Rogers et al. |
| 9,929,053 B2 | 3/2018 | Bower et al. |
| 10,361,677 B2 | 7/2019 | Bower et al. |
| 2001/0022564 A1 | 9/2001 | Youngquist et al. |
| 2002/0096994 A1 | 7/2002 | Iwafuchi et al. |
| 2003/0141570 A1 | 7/2003 | Chen et al. |
| 2004/0029356 A1 | 2/2004 | Timme et al. |
| 2004/0085160 A1* | 5/2004 | Nishimura ............. H03H 9/568 333/189 |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0275615 A1 | 12/2005 | Kahen et al. |
| 2006/0063309 A1 | 3/2006 | Sugiyama et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2007/0228880 A1 | 10/2007 | Higuchi et al. |
| 2008/0211734 A1 | 9/2008 | Huitema et al. |
| 2009/0315054 A1 | 12/2009 | Kim et al. |
| 2010/0078670 A1 | 4/2010 | Kim et al. |
| 2010/0123268 A1 | 5/2010 | Menard |
| 2010/0148198 A1 | 6/2010 | Sugizaki et al. |
| 2010/0214247 A1 | 8/2010 | Tang et al. |
| 2010/0248484 A1 | 9/2010 | Bower et al. |
| 2010/0258710 A1 | 10/2010 | Wiese et al. |

(56) References Cited

U.S. PATENT DOCUMENTS

| | | |
|---|---|---|
| 2010/0306993 A1 | 12/2010 | Mayyas et al. |
| 2010/0317132 A1 | 12/2010 | Rogers et al. |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0140959 A1* | 6/2013 | Shin .......... H03H 3/02 310/349 |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0316487 A1 | 11/2013 | de Graff et al. |
| 2014/0084482 A1 | 3/2014 | Hu et al. |
| 2014/0104243 A1 | 4/2014 | Sakariya et al. |
| 2014/0159043 A1 | 6/2014 | Sakariya et al. |
| 2014/0159065 A1 | 6/2014 | Hu et al. |
| 2014/0159548 A1* | 6/2014 | Burak .......... H03H 9/173 310/346 |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0318328 A1 | 11/2015 | Bibl et al. |
| 2015/0357993 A1 | 12/2015 | Shealy |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018491 A1 | 1/2016 | Bower et al. |
| 2016/0064363 A1 | 3/2016 | Bower et al. |
| 2016/0093600 A1 | 3/2016 | Bower et al. |
| 2017/0048976 A1 | 2/2017 | Prevatte et al. |
| 2017/0154819 A1 | 6/2017 | Bower et al. |
| 2017/0244386 A1 | 8/2017 | Bower et al. |
| 2017/0310299 A1 | 10/2017 | Bower et al. |
| 2017/0338374 A1 | 11/2017 | Zou et al. |

FOREIGN PATENT DOCUMENTS

| | | |
|---|---|---|
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel. B. et al., Printing meets lithography: Soft approaches to high-resolution patterning, J. Res. & Dev. 45(5):697-708, (2001).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Lee, S. H. etal, Laser Lift-Offof GaN Thin Film and its Application to the Flexible Light Emitting Diodes, Proc. of SPIE, 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Trindade, A.J. et al., Precision transfer printing of ultra-thin AlInGaN micron-size light-emitting diodes, Crown, pp. 217-218, (2012).

Yamashita, T. et al., Piezoelectric Strain Sensor Array Fabricated by Transfer Printing Methods, 2015 IEEE Sensors, 4 pages and 1 page IEEE Xplore abstract, date of conference: Nov. 1-4, 2015.

Yaniv et al., A 640 × 480 Pixel Computer Display Using Pin Diodes with Device Redundancy, 1988 International Display Research Conference, IEEE, CH-2678-1/88:152-154 (1988).

* cited by examiner

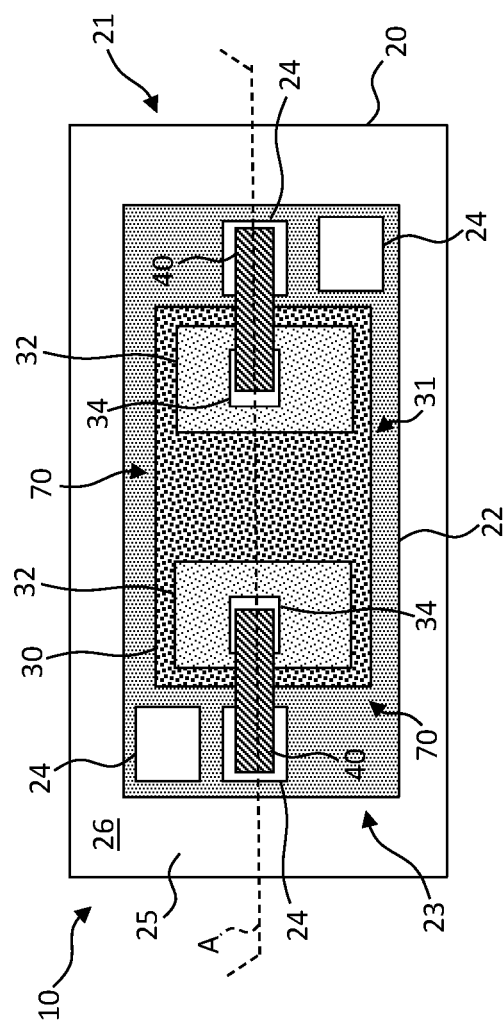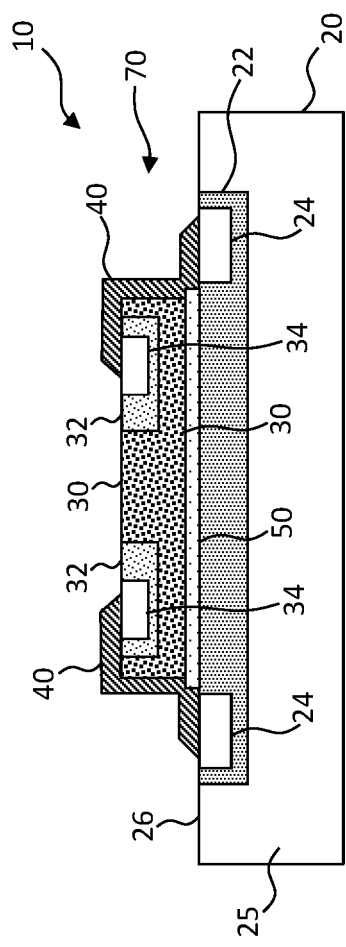
FIG. 1A
FIG. 1B

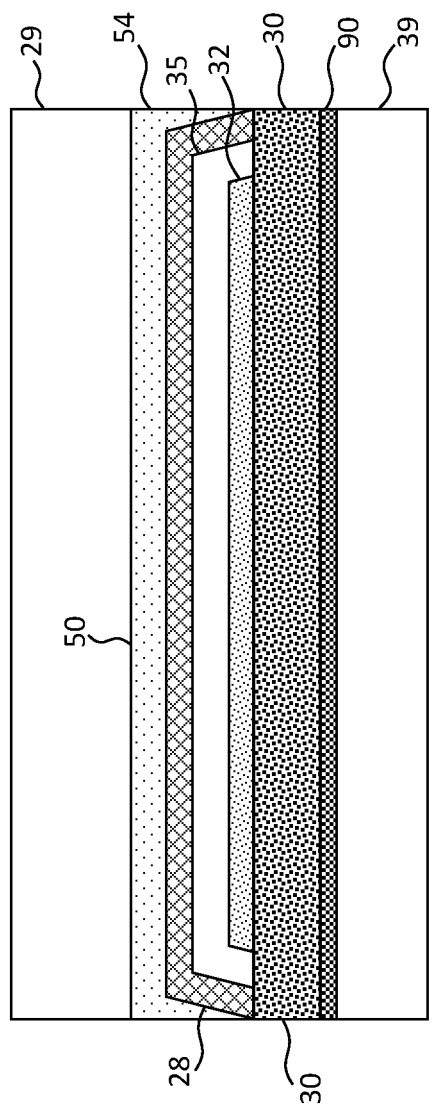
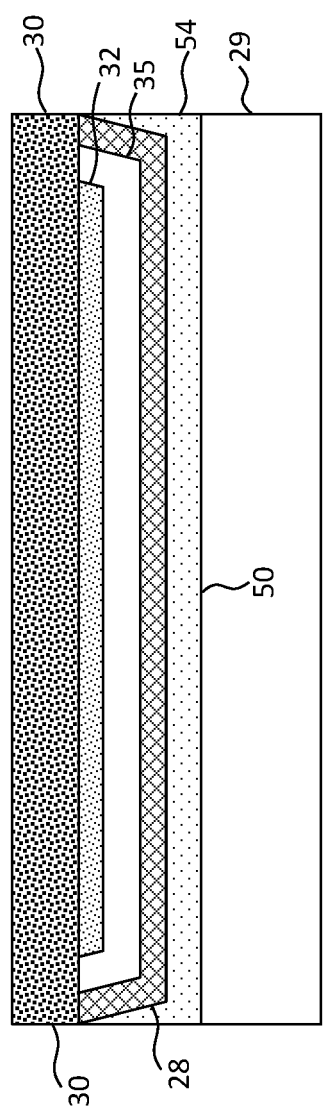
FIG. 9H
FIG. 9I

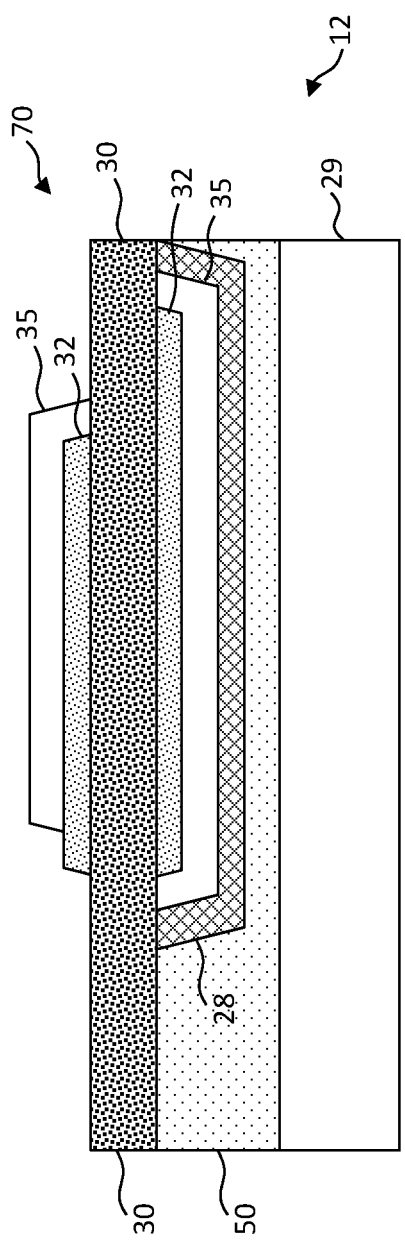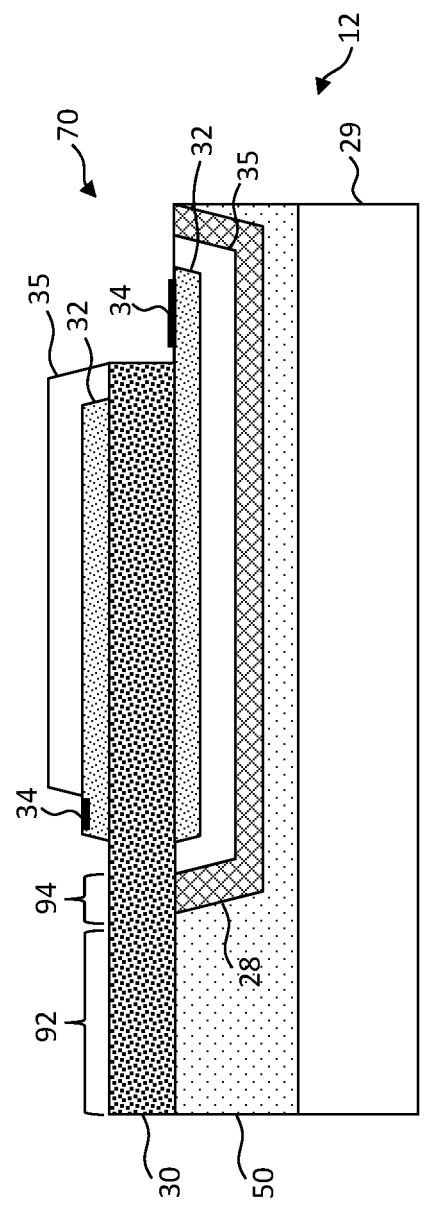

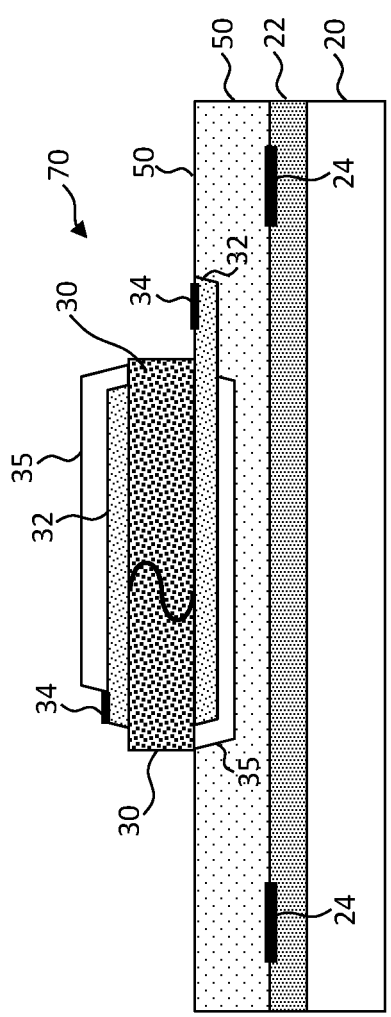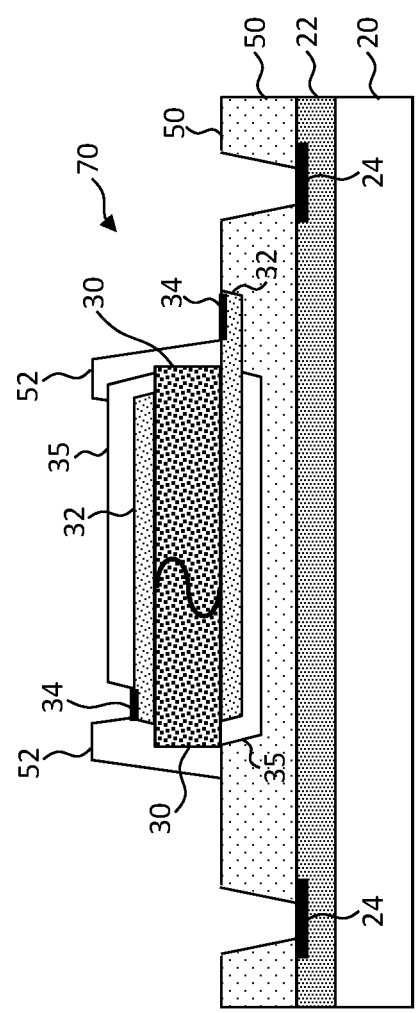

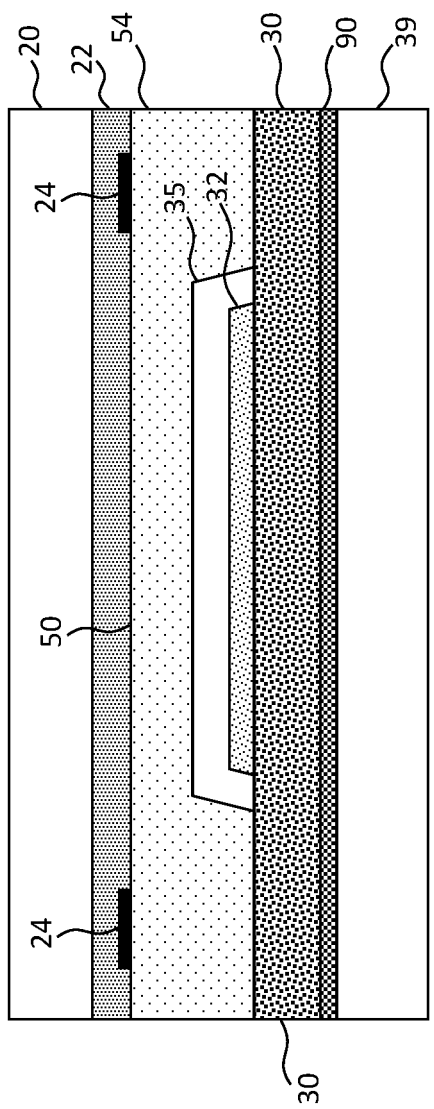
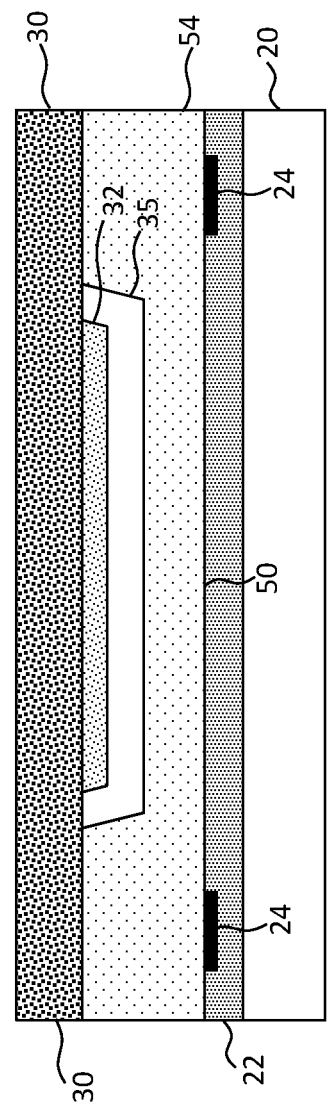
FIG. 11A
FIG. 11B

MICRO-TRANSFER-PRINTED ACOUSTIC WAVE FILTER DEVICE

PRIORITY APPLICATION

The present application is a continuation of U.S. patent application Ser. No. 15/047,250, filed on Feb. 18, 2016, entitled Micro-Transfer-Printed Acoustic Wave Filter Device, the content of which is hereby incorporated by reference herein in its entirety.

FIELD OF THE INVENTION

The present invention relates to integrated heterogeneous structures, and more particularly to an acoustic wave filter micro-transfer printed onto a semiconductor substrate.

BACKGROUND OF THE INVENTION

Electronic circuits are widely used in communication devices. In particular, mobile devices that rely upon modulated electromagnetic radiation to communicate a signal require filters to remove noise from received electronic signals and, in particular, to remove frequencies outside a desired range. Such filtering can be done in a variety of ways, for example, with electromechanical filters, with resonant electronic circuits such as tuned resonant tank circuits including various combinations of resistors, capacitors, and inductors, and with digital filters using digital signal processors to filter digitized electronic signals.

Electromechanical filters have been used extensively in radio communications for many decades. Such filters depend upon electromechanical piezoelectric materials that mechanically (acoustically) resonate at a desired frequency and that either respond mechanically to electrical stimulation or produce an electrical signal in response to mechanical stimulation. Electromechanical filters using piezoelectric materials are variously known as acoustic filters, acoustic wave filters, acoustic resonators, crystal filters, or crystal oscillators. A variety of useful piezoelectric materials are known. For example, quartz has been used for more than 80 years because of its low coefficient of thermal expansion and high quality factors.

In recent years, different acoustically resonant modes have been exploited in piezoelectric materials, including surface acoustic wave (SAW) filters and bulk acoustic wave (BAW) filters. U.S. Pat. Nos. 5,313,177, and 7,307,369 describe surface acoustic wave devices. U.S. Pat. No. 5,872, 493 teaches a bulk acoustic wave (BAW) filter having a protective acoustic mirror. Acoustic mirrors are also known as reflector layers or acoustic reflectors. Single crystal acoustic resonators (SCARs) are also known, for example, as disclosed in U.S. patent application Ser. No. 14/796,939.

In many applications, for example, mobile communication devices found in cellular telephones, size and weight are important device attributes and therefore electronic circuits are preferably small, light, low cost, and highly integrated. Electromechanical filters are used as components in electronic circuits and there is, therefore, a need for improved integration of such filters in electronic circuits for telecommunication devices.

SUMMARY OF THE INVENTION

Embodiments of the present invention provide a compound acoustic wave filter device comprising a support substrate having. An acoustic wave filter includes a piezoelectric filter element and two or more electrodes. The acoustic wave filter is micro-transfer printed onto the semiconductor substrate. The electrodes can form or be connected to one or more transducers, for example a single transducer. Alternatively, the electrodes, for example, four electrodes can form or be connected to a first transducer for converting a first electrical signal to an acoustic wave in or on the filter element and a second transducer for converting the acoustic wave to a second electrical signal different from the first electrical signal. One or more electrical conductors electrically connect one or more of the circuit connection pads to one or more of the electrodes. Acoustic wave filters of the present invention can be surface acoustic wave filters or bulk acoustic wave filters and can include a resonant crystalline material. As used herein, acoustic wave filters are also filters, electromechanical filters, acoustic filters, acoustic resonators, crystal filters, or crystal oscillators.

In an embodiment, the support substrate is a semiconductor substrate having an active electronic circuit formed in or on the semiconductor substrate and electrically connected to one or more of the circuit connection pads. The active electronic circuit can control, at least in part, the acoustic wave filter. The piezoelectric filter element can include or be a substrate or layer separate, distinct, and independent from the support substrate. The filter element, acoustic wave filter, or the support substrate can be bare dies.

By micro-transfer printing the acoustic wave filter onto the adhesive layer and over the support substrate, the compound acoustic wave filter device of the present invention is more highly integrated and therefore smaller and less expensive than alternative designs and can have better performance. Thus, the compound acoustic wave filter device of the present invention can be packaged in a single package rather than two separate packaged devices interconnected on a third substrate such as a printed circuit board. The filter element can be micro-transfer printed on the adhesive layer and on or over the support substrate or active electronic circuit, further reducing the device size and improving the device integration. Furthermore, by micro-transfer printing the acoustic wave filter onto the adhesive layer and on or over the support substrate, the length and extent of the electrical connections between the support substrate and the filter element are reduced, reducing noise, increasing operating frequencies and generally increasing the device performance, especially for applications requiring relatively high operating frequencies such as are commonly found in mobile telecommunications systems such as cellular telephones. In a further embodiment of the present invention, a plurality of filter elements is micro-transfer printed on an adhesive layer and adhered to a single support substrate, enabling multiple acoustic wave filter operations within a single packaged device, such as a surface-mount device. In an embodiment of the present invention, the support substrate and any conductors or active electronic circuits on the support substrate are constructed and processed separately from the piezoelectric filter element and electrodes.

In a further embodiment of the present invention, an acoustic wave filter wafer includes a wafer of substrate material having a patterned sacrificial layer forming sacrificial portions on, over, or in the substrate material, a surface of the substrate material, the wafer, or a surface of the wafer. The sacrificial portions separate anchors between the sacrificial portions. A piezoelectric acoustic wave filter is formed entirely over each sacrificial portion, the acoustic wave filter comprising a layer of piezoelectric material and two or more electrodes in or on the piezoelectric material. The portion of each acoustic wave filter in contact with the sacrificial portion is chemically and selectively etch-resistant so that the contact portion has a chemical selectivity different from the patterned sacrificial layer.

In a method of the present invention, a support substrate is provided and a piezoelectric filter element is provided and electrodes are formed in or on the filter substrate to form an acoustic wave filter. One or more filter elements are mounted on the support substrate by micro-transfer printing and one or more of the circuit connection pads are electrically connected to the one or more electrodes through the filter connection pads to construct a compound acoustic wave filter device.

The acoustic wave filters are made by providing a support wafer, for example, a glass wafer. A buffer layer is deposited on the support wafer and provides a surface on which a piezoelectric layer is formed, for example by chemical vapor deposition or atomic layer deposition. One or more electrodes are patterned on the piezoelectric layer. An optional acoustic mirror layer is optionally formed on the electrode. A sacrificial layer is patterned over the optional mirror layer or electrode. A source wafer (also referred to as a handle wafer in this process) is provided and adhered to the adhesive layer. The support wafer and optionally the optional buffer layer are removed and the structure is arranged to provide a process surface on the piezoelectric filter layer. In one embodiment (for example to form a bulk acoustic wave filter rather than a surface acoustic wave filter), a second electrode is patterned on the filter substrate and an optional second acoustic mirror layer is formed over the electrode. The filter substrate is processed to expose the patterned sacrificial layer, optional dielectric insulators are patterned to insulate the filter substrate, if necessary, and filter connection pads are formed to provide a micro-transfer printable acoustic wave filter.

In another method of the present invention, a sacrificial layer is not formed. Instead, the support wafer and circuit connection pads are adhered to the adhesive layer instead of the source/handle wafer and the support wafer and optional buffer layer are removed. In this embodiment, the second electrodes and optional second mirror layer (if present) are formed and patterned directly over the filter elements and over the support substrate. This avoids the etching process for the individual acoustic wave filters. This approach is particularly useful if the compound acoustic wave filter device itself is a micro-transfer printable device having a sacrificial layer in the source wafer or under the active electronic circuit and etched to form a micro-transfer printable compound acoustic wave filter device using compound micro-assembly methods.

In a further embodiment of the present invention, a heterogeneous device comprises a first substrate comprising a first material and an active first circuit formed in or on the first substrate. The active first circuit includes one or more first connection pads connected to the active first circuit for providing signals to the active first circuit or receiving signals from the active first circuit. A second substrate separate, distinct, and independent from the first substrate comprises a second material different from the first material. The second substrate is directly or indirectly micro-transfer printed on or adhered to the first substrate and includes two or more electrodes or a second circuit formed in or on the second substrate. The two or more electrodes include two or more second connection pads connected to the electrodes or second circuit for providing signals or receiving signals from the electrodes or second circuit. One or more electrical conductors electrically connect one or more of the first connection pads to one or more of the second connection pads. The second substrate can include a second active circuit that incorporates the electrodes, for example including transistors or diodes. The second substrate can be micro-transfer printed directly or indirectly on or over the active first circuit, further reducing the device size and improving the device integration. In a further embodiment of the present invention, a plurality of second substrates is micro-transfer printed onto or adhered to a single first substrate, enabling multiple operations within a single packaged device. The device can be a surface-mount device. In an embodiment of the present invention, the active first substrate and first circuit are constructed and processed separately from the second substrate and electrodes or second circuit.

Embodiments of the present invention therefore enable devices comprising a variety of different heterogeneous materials that can each be processed or assembled separately using different, possibly incompatible, processes. By using semiconductor materials in at least the first substrate, the devices can incorporate logic circuits, such as state machines or computers such as digital stored program machines. Thus, embodiments of the present invention provide intelligent, highly integrated heterogeneous devices useful in a wide variety of applications and modalities.

In one aspect, the disclosed technology includes a compound acoustic wave filter device, the device including: a support substrate having two or more circuit connection pads; an acoustic wave filter comprising a piezoelectric filter element and two or more electrodes on the piezoelectric filter element; an adhesive layer located between the support substrate and the acoustic wave filter, wherein the acoustic wave filter is micro-transfer printed on the adhesive layer and the adhesive layer adheres the support substrate to the acoustic wave filter; and two or more electrical conductors, each electrical conductor electrically connecting one of the electrodes to one of the circuit connection pads.

In certain embodiments, the two or more electrodes are formed on a common side of the piezoelectric filter element and the acoustic wave filter is a surface acoustic wave filter.

In certain embodiments, the two or more electrodes are formed on opposite sides of the piezoelectric filter element and the acoustic wave filter is a bulk acoustic wave filter.

In certain embodiments, the acoustic wave filter or the piezoelectric filter element includes at least a portion of a tether.

In certain embodiments, the piezoelectric filter element has a piezoelectric filter element area that is smaller than the area of the support substrate.

In certain embodiments, the acoustic wave filter is directly or indirectly adhered to the support substrate with an adhesive layer.

In certain embodiments, the adhesive is a cured adhesive.

In certain embodiments, the layer of adhesive has an extent over the support substrate that is different from the extent of the acoustic wave filter.

In certain embodiments, the support substrate is a semiconductor substrate and comprising an active electronic circuit formed in or on the semiconductor substrate, the active electronic circuit electrically connected to one or more of the circuit connection pads.

In certain embodiments, the active electronic circuit is located at least partially between the acoustic wave filter and the semiconductor substrate.

In certain embodiments, the semiconductor substrate is a silicon semiconductor substrate, a compound semiconductor substrate, a III-V semiconductor substrate, a crystalline material substrate, or a crystalline semiconductor material substrate.

In certain embodiments, the semiconductor substrate has a process side, the electronic circuit is formed on or in the process side, and the acoustic wave filter is micro-transfer printed on the process side.

In certain embodiments, the piezoelectric filter element is a semiconductor, a compound semiconductor, a III-V semiconductor, a II-VI semiconductor, GaN, AlGaN, a ceramic a synthetic ceramic, gallium orthophosphate (GaPO4), Langasite (La3Ga5SiO14), lead titanate, barium titanate (BaTiO3), lead zirconate titanate (Pb[ZrxTi1−x]O3 0≤x≤1), potassium niobate (KNbO3), lithium niobate (LiNbO3), lithium tantalate (LiTaO3), sodium tungstate (Na2WO3), Ba2NaNb5O5, Pb2KNb5O15, zinc oxide (ZnO), Sodium potassium niobate ((K,Na)NbO3) (NKN), bismuth ferrite (BiFeO3), Sodium niobate (NaNbO3), bismuth titanate (Bi4Ti3O12), sodium bismuth titanate (Na0.5Bi0.5TiO3), wurtzite, or polyvinylidene fluoride.

In certain embodiments, the device includes an acoustic mirror layer located on a side of one of the electrodes opposite the filter element with the filter element between the support substrate and the acoustic mirror layer, an acoustic mirror layer located on a side of one of the electrodes with the acoustic mirror layer between the support substrate and the filter element, or both.

In certain embodiments, at least one of the acoustic mirror layers is chemically etch-resistant.

In certain embodiments, at least one of the electrodes is chemically etch resistant.

In certain embodiments, the piezoelectric filter element is thicker than the support substrate.

In certain embodiments, the piezoelectric filter element is thinner than the support substrate.

In certain embodiments, the support substrate has a thickness less than or equal to 20 microns, 10 microns, or 5 microns.

In certain embodiments, the piezoelectric filter element has a thickness less than or equal to 10 microns, 5 microns, or 1 micron.

In certain embodiments, the piezoelectric filter element has a thickness greater than or equal to 0.5 microns, 1 micron, 2 microns, or 5 microns.

In certain embodiments, the electrodes form a plurality of electrode pairs on or in the filter element, and wherein each of the electrodes is connected to a circuit connection pad with an electrical conductor.

In certain embodiments, the device includes a plurality of the acoustic wave filters micro-transfer printed on the adhesive layer, wherein each electrode of each of the piezoelectric filter elements is connected to a circuit connection pad with an electrical conductor and, optionally, wherein two or more of the circuit connection pads are electrically connected on the support substrate.

In certain embodiments, a first acoustic wave filter of the plurality of acoustic wave filters has one or more first attributes, a second acoustic wave filter of the plurality of acoustic wave filters has one or more second attributes and wherein at least one of the first attributes is different from at least one of the second attributes.

In certain embodiments, the compound acoustic wave filter device or the support substrate has a length or breadth dimension of less than or equal to 1 mm, less than or equal to 800 μm, less than or equal to 600 μm, less than or equal to 400 μm, less than or equal to 200 μm, less than or equal to 100 μm, less than or equal to 50 μm, or less than or equal to 20 μm.

In certain embodiments, the compound acoustic wave filter device is a surface-mount device.

In certain embodiments, the support substrate or piezoelectric filter element has at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height from 2 to 5 μm, 4 to 10 μm, 10 to 20 μm, or 20 to 50 μm.

In certain embodiments, at least two of the electrodes define capacitors that form an electrical or magnetic field when an electrical potential is applied to the two electrodes causing an acoustic wave in the piezoelectric filter element.

In certain embodiments, at least two of the electrodes define capacitors that form an electrical signal in response to an electrical or magnetic field provided by the piezoelectric filter element.

In certain embodiments, the electrical conductors are electrically conductive protrusions or spikes extending from the acoustic wave filter, a portion or layer of the acoustic wave filter, or the filter element.

In another aspect, the disclosed technology includes a method of making a compound acoustic wave filter device, including: providing a support substrate having two or more circuit connection pads; providing an acoustic wave filter, the acoustic wave filter comprising a piezoelectric filter element and two or more electrodes in or on the piezoelectric filter element; providing an adhesive layer located between the support substrate and the acoustic wave filter; micro-transfer printing the acoustic wave filter onto the adhesive layer and adhering the support substrate to the acoustic wave filter; and electrically connecting each of the electrodes to one or more of the circuit connection pads with electrical conductors.

In certain embodiments, the support substrate is a semiconductor substrate, and comprising providing the semiconductor substrate with an active electronic circuit formed in or on the semiconductor substrate, the active electronic circuit electrically connected to one or more of the circuit connection pads.

In certain embodiments, the active electronic circuit is located at least partially between the acoustic wave filter and the semiconductor substrate.

In certain embodiments, the semiconductor substrate has a process side, the active electronic circuit is formed on or in the process side, and the acoustic wave filter is micro-transfer printed on the process side.

In certain embodiments, the adhesive is a curable adhesive and the method comprises curing the adhesive layer to adhere the acoustic wave filter to the support substrate after the acoustic wave filter is micro-transfer printed onto the adhesive layer.

In certain embodiments, the electrical conductors are electrically conductive protrusions or spikes extending from the acoustic wave filter or the filter element, and comprising pressing the electrically conductive protrusions or spikes against, into, or through the circuit connection pads to form an electrical connection between the electrodes and the circuit connection pads.

In certain embodiments, the method includes providing four or more electrodes on the filter element forming two or more acoustic wave filters on the filter element; and electrically connecting each of the electrodes to one or more of the circuit connection pads with the electrical conductors.

In certain embodiments, the method includes providing a plurality of acoustic wave filters having a corresponding plurality of filter elements;

micro-transfer printing the plurality of acoustic wave filters and filter elements onto the adhesive layer; and electrically connecting each of the electrodes of each of the filter elements to one or more of the circuit connection pads with the electrical conductors.

In certain embodiments, a first acoustic wave filter of the plurality of acoustic wave filters has one or more first attributes, a second acoustic wave filter of the plurality of acoustic wave filters has one or more second attributes, and wherein at least one of the first attributes is different from at least one of the second attributes.

In certain embodiments, the method includes providing a first acoustic wave filter wafer having first acoustic wave filters, a second acoustic wave filter wafer having second acoustic wave filters, and wherein micro-transfer printing the plurality of acoustic wave filters and filter elements onto the adhesive layer includes micro-transfer printing first acoustic wave filters from the first acoustic wave filter substrate and micro-transfer printing second acoustic wave filters from the second acoustic wave filter substrate.

In certain embodiments, the first acoustic wave filters of the acoustic waver filter wafer have one or more first attributes, the second acoustic wave filters of the second acoustic waver filter wafer have one or more second attributes, and wherein at least one of the first attributes is different from at least one of the second attributes.

In certain embodiments, the filter element has an area that is smaller than the area of the support substrate.

In certain embodiments, the filter element is a semiconductor, a compound semiconductor, a III-V semiconductor, a II-VI semiconductor, a ceramic, GaN, AlGaN, a synthetic ceramic, gallium orthophosphate (GaPO4), Langasite (La3Ga5SiO14), lead titanate, barium titanate (BaTiO3), lead zirconate titanate (Pb[ZrxTi1-x]O3 0≤x≤1), potassium niobate (KNbO3), lithium niobate (LiNbO3), lithium tantalate (LiTaO3), sodium tungstate (Na2WO3), Ba2NaNb5O5, Pb2KNb5O15, zinc oxide (ZnO), Sodium potassium niobate ((K,Na)NbO3) (NKN), bismuth ferrite (BiFeO3), Sodium niobate (NaNbO3), bismuth titanate (Bi4Ti3O12), sodium bismuth titanate (Na0.5Bi0.5TiO3), wurtzite, or polyvinylidene fluoride.

In certain embodiments, the support substrate is a semiconductor substrate, a silicon semiconductor substrate, a compound semiconductor substrate, or a III-V semiconductor substrate.

In certain embodiments, the support substrate is a crystalline semiconductor substrate.

In certain embodiments, the filter element is a crystalline or ceramic piezoelectric material substrate.

In certain embodiments, the filter element is chemically etch-resistant.

In certain embodiments, at least one of the electrodes is chemically etch-resistant.

In certain embodiments, the method includes disposing an acoustic mirror layer on a side of one of the electrodes opposite the filter element or disposing an acoustic mirror layer on a side of each of the electrodes opposite the filter element.

In certain embodiments, at least one of the acoustic mirror layers is chemically etch-resistant.

In certain embodiments, the filter element is thicker than the support substrate.

In certain embodiments, the filter element is thinner than the support substrate.

In certain embodiments, the support substrate has a thickness of less than or equal to 20 microns, 10 microns, or 5 microns.

In certain embodiments, the filter element has a thickness less than or equal to 10 microns, 5 microns, or 1 micron.

In certain embodiments, the filter element has a thickness greater than or equal to 0.5 microns, 1 micron, 2 microns, or 5 microns.

In certain embodiments, the support substrate or filter element has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm.

In certain embodiments, the compound acoustic wave filter device is a surface-mount device.

In another aspect, the disclosed technology includes an acoustic wave filter wafer, including: a source wafer of substrate material; a patterned sacrificial layer forming sacrificial portions on, over, or in the substrate material, a surface of the substrate material, the source wafer, or a surface of the source wafer, the sacrificial portions defining separate anchors between the sacrificial portions; a piezoelectric acoustic wave filter formed entirely over each sacrificial portion, the acoustic wave filter comprising (i) a layer of piezoelectric material and (ii) two or more electrodes in or on the piezoelectric material; and wherein the portion of the acoustic wave filter in contact with the sacrificial portion is chemically and selectively etch-resistant so that the contact portion has a chemical selectivity different from the patterned sacrificial layer and wherein the piezoelectric acoustic wave filter is attached to the anchor with at least one tether.

In certain embodiments, the contact portion is a portion of the layer of piezoelectric material or all of or a portion of an electrode.

In certain embodiments, the wafer including one or more acoustic mirrors, each acoustic mirror disposed on a side of an electrode opposite the layer of piezoelectric material, and wherein the contact portion is an acoustic mirror.

In certain embodiments, the patterned sacrificial layer is a patterned layer of etchable material or a gap between the etch-resistant acoustic filter structure and the substrate material.

In another aspect, the disclosed technology includes a method of making an acoustic wave filter wafer, the method including: providing a support wafer and forming an optional buffer layer on the support wafer; forming a piezoelectric material element on the buffer layer or the support wafer; forming an electrode on the piezoelectric material element; and forming a patterned sacrificial layer on or over the electrode.

In certain embodiments, the method includes forming an adhesive layer on or over the patterned sacrificial layer; providing a source wafer; and adhering the source wafer to the patterned sacrificial layer with the adhesive layer.

In certain embodiments, the adhesive layer is curable and comprising only curing the adhesive layer.

In certain embodiments, the method includes removing the support wafer and optionally removing the optional buffer layer.

In certain embodiments, the method includes etching the patterned sacrificial layer to form a micro-transfer printable acoustic wave filter.

In certain embodiments, the electrode is a first electrode and comprising forming one or more second electrodes on the same side of the piezoelectric material element as the first electrode, to form a micro-transfer printable surface acoustic wave filter.

In certain embodiments, the method includes forming an acoustic mirror on or over the electrode.

In certain embodiments, the electrode is a first electrode and comprising forming a second electrode on a side of the piezoelectric material element opposite the first electrode, to form a micro-transfer printable bulk acoustic wave filter.

In certain embodiments, the method includes forming an acoustic mirror on or over the second electrode.

In another aspect, the disclosed technology includes a heterogeneous device, the device including: a first substrate comprising a first material; an active first circuit formed in or on the first substrate, the active first circuit comprising one or more first connection pads connected to the active first circuit for providing signals to the active first circuit or receiving signals from the active first circuit; a second substrate separate, distinct, and independent from the first substrate, the second substrate comprising a second material different from the first material, and the second substrate directly or indirectly micro-transfer printed on the first substrate; two or more electrodes or a second circuit formed in or on the second substrate, the electrodes or second circuit comprising one or more second connection pads connected to the electrodes or second circuits for providing signals to the electrodes or receiving signals from the electrodes; and one or more electrical conductors electrically connecting one or more of the first connection pads to one or more of the second connection pads.

In certain embodiments, the device includes a plurality of the electrode pairs or second circuits formed on or in the second substrate wherein the first connection pads are electrically connected to the second connection pads of the plurality of electrode pairs or second circuits with the one or more electrical conductors.

In certain embodiments, the device includes a plurality of the separate, distinct, and independent second substrates micro-transfer printed on the first substrate wherein the first connection pads are connected to the second connection pads with the one or more electrical conductors.

In certain embodiments, the second substrate is micro-transfer printed directly or indirectly on the first circuit formed on or in the first substrate.

In certain embodiments, the first circuit is located at least partially between the second substrate and at least portions of the first substrate.

In certain embodiments, the second substrate is adhered to the first substrate with a layer of adhesive.

In certain embodiments, the second substrate includes at least a portion of a tether.

In certain embodiments, the second substrate is crystalline, a semiconductor, a crystalline semiconductor, or a ceramic.

In certain embodiments, the first substrate has a length or breadth dimension of less than or equal to 1 mm, less than or equal to 800 µm, less than or equal to 600 µm, less than or equal to 400 µm, or less than or equal to 200 µm.

In certain embodiments, the heterogeneous device is a surface mount device.

In certain embodiments, the first substrate or the second substrate has a width from 2 to 5 µm, 5 to 10 µm, 10 to 20 µm, or 20 to 50 µm, the first substrate or the second substrate has a length from 2 to 5 µm, 5 to 10 µm, 10 to 20 µm, or 20 to 50 µm, or the first substrate or the second substrate has a height from 2 to 5 µm, 4 to 10 µm, 10 to 20 µm, or 20 to 50 µm.

In certain embodiments, the second connection pads are electrically conductive protrusions or spikes extending from the second substrate in electrical contact with the first connection pads and constitute the one or more electrical conductors.

In certain embodiments, the heterogeneous device is a surface-mount device.

In another aspect, the disclosed technology includes a method of making a heterogeneous device, the method including: providing a first substrate with an active first circuit formed in or on the first substrate, the first circuit comprising one or more first connection pads connected to the first circuit for providing signals to the first circuit or receiving signals from the first circuit; providing a second substrate separate, distinct, and independent from the first substrate, two or more electrodes or a second circuit formed in or on the second substrate, and two or more second connection pads connected to the electrodes or second circuit for providing signals to or receiving signals from the electrodes or second circuit; directly or indirectly micro-transfer printing the second substrate on the first substrate; and electrically connecting one or more of the first connection pads to one or more of the second connection pads.

In certain embodiments, the method includes providing a plurality of electrode pairs or second circuits on the second substrate; and electrically connecting one or more of the second connection pads of each of the second circuits to one or more of the first connection pads.

In certain embodiments, the method includes providing a plurality of second substrates; mounting the second substrates on the first substrate; and electrically connecting one or more of the second connection pads of each of the second substrates to one or more of the first connection pads.

In certain embodiments, the second connection pads are electrically conductive protrusions or spikes extending from the second substrate, and comprising pressing the electrically conductive protrusions or spikes against or into the first connection pads to form an electrical connection between the second circuit and the first circuit so that the electrically conductive protrusions or spikes form the one or more electrical conductors.

In certain embodiments, the second substrate is micro-transfer printed directly or indirectly onto the first circuit formed on or in the first substrate.

In certain embodiments, the first circuit is located at least partially between the second substrate and at least portions of the first substrate.

In certain embodiments, the second substrate comprises at least a portion of a tether.

In certain embodiments, the first substrate or the second substrate has a width from 2 to 5 µm, 5 to 10 µm, 10 to 20 µm, or 20 to 50 µm, the first substrate or the second substrate has a length from 2 to 5 µm, 5 to 10 µm, 10 to 20 µm, or 20 to 50 µm, or the first substrate or the second substrate has a height from 2 to 5 µm, 4 to 10 µm, 10 to 20 µm, or 20 to 50 µm.

In certain embodiments, the heterogeneous device is a surface-mount device.

In another aspect, the disclosed technology includes a method of making an acoustic wave filter wafer, the method including: providing a support wafer and forming an optional buffer layer on the support wafer; forming a piezoelectric material element on the buffer layer or the support wafer; forming one or more electrodes on the piezoelectric material element; optionally forming an acoustic mirror layer on the one or more electrodes; providing a semiconductor substrate with an active electronic circuit formed in or on the semiconductor substrate, the active electronic circuit comprising one or more circuit connection pads connected to the active electronic circuit for providing signals to the active electronic circuit or receiving signals from the active electronic circuit; adhering the semiconductor substrate to the one or more electrodes or acoustic mirror layer; removing the support wafer and optionally removing the optional buffer layer; and electrically connecting the electrode to the active electronic circuit.

In certain embodiments, the electrode is a first electrode and comprising forming a second electrode on a side of the piezoelectric material opposite the first electrode and electrically connected the second electrode to the active electronic circuit.

In certain embodiments, the method includes forming an acoustic mirror on or over the second electrode.

In certain embodiments, the method includes forming an acoustic mirror on or over the piezoelectric material layer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a schematic plan view of an embodiment of the present invention;

FIG. 1B is a cross section of an embodiment of the present invention taken across the cross section line A of FIG. 1A;

FIGS. 9A-9M are sequential cross sections illustrating a method of making a compound acoustic filter wafer and device of the present invention;

FIGS. 11A-11C are sequential cross sections illustrating a method of making a device of the present invention.

Figure 1C:
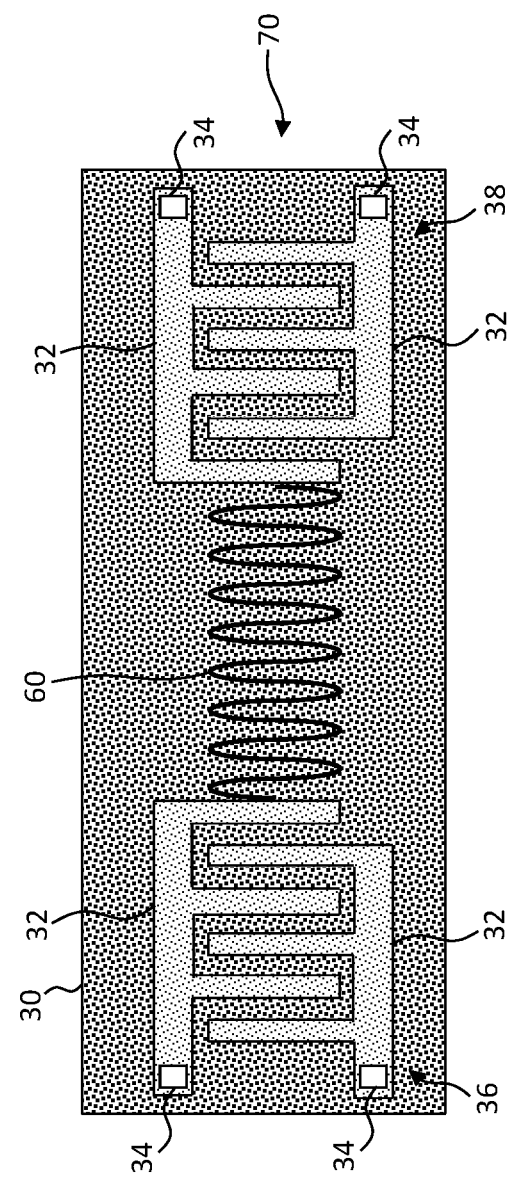
FIG. 1C is a detail schematic plan view of a piezoelectric substrate and electrodes according to an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the schematic plan view of FIG. 1A, the schematic cross section of FIG. 1B taken across cross section line A of FIG. 1A, and the detail schematic plan view of FIG. 1C, in an embodiment of the present invention, a compound acoustic wave filter device 10 includes a support substrate 20. In one embodiment, the support substrate is a semiconductor substrate that includes an active electronic circuit 22 formed in or on the semiconductor support substrate 20, for example, using photolithographic methods found in the integrated circuit industry. The active electronic circuit 22 can be, for example, an RF circuit for filtering, amplifying, or otherwise processing radio frequency signals. The support substrate 20 or active electronic circuit 22 includes two or more circuit connection pads 24 for providing signals to the active electronic circuit 22 or receiving signals from the active electronic circuit 22, if present. An acoustic wave filter 70 includes a piezoelectric filter element 30 and two or more electrodes on the piezoelectric filter element. The acoustic wave filter 70 is micro-transfer printed with an adhesive layer 50 between the support substrate 20 and the acoustic wave filter 70.

The adhesive layer can be a layer formed on the support substrate 20 or on the acoustic wave filter 70, or a layer located between the support substrate 20 and the acoustic wave filter 70. The adhesive layer 50 can be patterned and need not be uniformly present over the support substrate 20. For example, the adhesive layer 50 can be present only in locations where the acoustic wave filters 30 are intended and can cover only a portion of the acoustic wave filter area 31. The adhesive layer 50 can be coated, provided as a laminate, or inkjet deposited either on the support substrate 20 or the acoustic wave filter 30. The inkjet deposition can provide a pattern of drops, for example, drops whose location corresponds to the location of the acoustic wave filters 70. The piezoelectric filter element 30 can include a substrate that is separate, distinct, and independent from the support substrate 20. The circuit connection pads 24 can be connected to the active electronic circuit 22, if present, and the active electronic circuit 22 can, at least in part, control the acoustic wave filter 70. Additional conductive elements such as wires can be provided on the support substrate 20, for example electrically connected to the circuit connection pads 24 forming a circuit, such as a passive circuit, or connected to the active electronic circuit 22, if present.

The compound acoustic wave filter device 10 is a compound device because it incorporates two different structures (e.g., the support substrate 20 and the acoustic wave filter 70); in an embodiment the support substrate 20 and the acoustic wave filter 70 include, incorporate, or are two different materials. The two different materials can have different attributes, can be processed separately, and can be photolithographic-process incompatible.

Two or more electrodes 32 are formed or disposed in or on the piezoelectric filter element 30 and are electrically connected to filter connection pads 34 for providing electrical signals to and from the electrodes 32. In cooperation with the filter element 30, the electrodes 32 can form or are connected to a transducer. Alternatively, referring specifically to FIG. 1C, in cooperation with the filter element 30 the electrodes 32 form or are connected to a first transducer 36 for converting a first electrical signal to an acoustic wave 60 that propagates in or on the filter element 30 and a second transducer 38 for converting the acoustic wave 60 to a second electrical signal different from the first electrical signal. This structure can form a surface acoustic wave filter 70.

One or more electrical conductors 40 electrically connect one or more of the circuit connection pads 24 to one or more of the electrodes 32 through the filter connection pads 34. The active electronic circuit 22 or additional conductive elements on the support substrate 20, if present, are thus electrically connected to the electrodes 32. The support substrate 20 can have a process side 26 over which the filter element 30 is micro-transfer printed. The filter element 30 can have a filter substrate area 31 that is smaller than the support substrate area 21 or the active electronic circuit area 23.

The piezoelectric filter element 30 is also referred to herein as a filter element 30, a piezoelectric substrate 30, piezoelectric layer 30, filter substrate 30, a filter layer 30, or second substrate 30. As discussed further below, the piezoelectric filter element 30 can first be deposited as a layer on another underlying layer and then, upon removal of the underlying layer, serve as a substrate for other layers.

The compound acoustic wave filter device 10 of the present invention can have the two or more electrodes 32 formed on a common side of the filter element 30 so that the acoustic wave filter 70 is a surface acoustic wave filter 70. Alternatively, referring to FIG. 2, the compound acoustic wave filter device 10 of the present invention can have the two or more electrodes 32 formed on opposite sides of the filter element 30 so that the acoustic wave filter 70 is a bulk acoustic wave filter 70.

Figure 2:
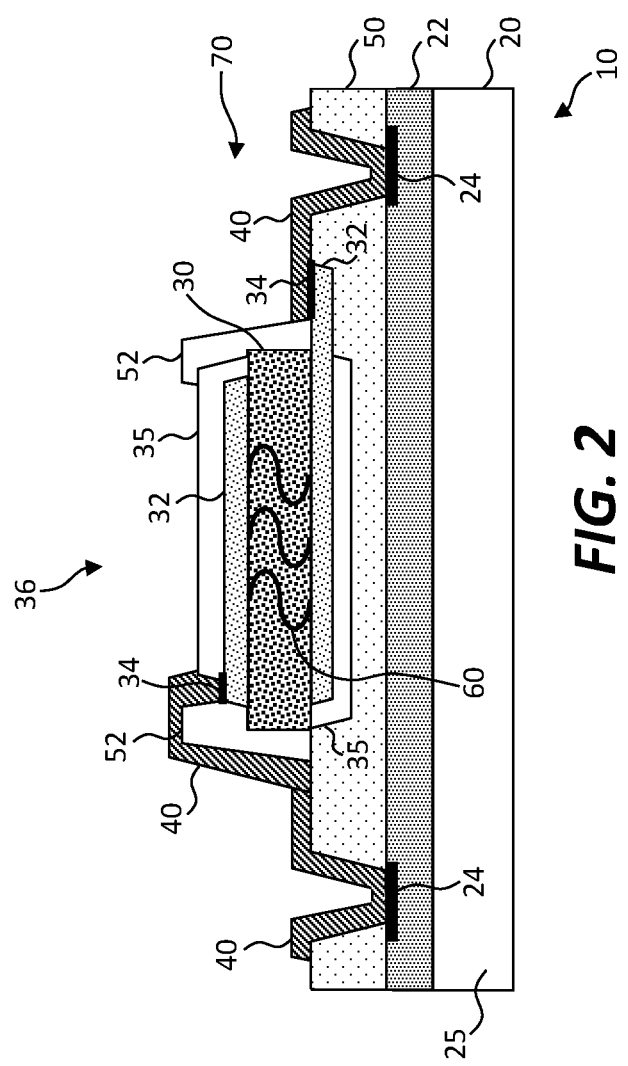
FIG. 2 is a cross section of another embodiment of the present invention.

As shown in FIGS. 1B and 2, the filter element 30 can be micro-transfer printed on or in combination with the adhesive layer and adhered directly to the support substrate 20, layers formed on the support substrate 20, or on the active electronic circuit 22 or additional conductive elements formed on or in the support substrate 20, if present. In an embodiment, the active electronic circuit 22 or additional conductive elements are a part of the support substrate 20 or form layers on the support substrate 20. The support substrate 20 can include semiconductor material 25 or non-semiconductor material or layers, for example conductive, patterned conductive layers, dielectric layers, or patterned dielectric layers. As used herein, micro-transfer printed on or over can include adhered to after a micro-transfer printing operation. A micro-transfer printed acoustic wave filter device 70 can include at least a portion of a tether 94 from a source wafer 29 on which the acoustic wave filter 70 originates. Portions of a tether 94 result from fracturing a tether 94 on a source wafer 29 during the micro-transfer printing process (described with respect to FIG. 9K below). The tethers 94 can be formed from one or more layers of the acoustic wave filter 70 or other layers disposed on the source wafer 29. In embodiments, the active electronic circuit 22 can be located at least partially between the acoustic wave filter 70 or the filter element 30 and the support substrate 20 (as shown). This arrangement can efficiently use the available area of the support substrate 20. Alternatively, the active electronic circuit 22 can be located to one or more of the sides of the filter element 30 or acoustic wave filter 70 (not shown).

To facilitate securing the filter element 30 to the support substrate 20, a layer 50 or pattern of adhesive is provided between the acoustic wave filter 70 and the support substrate 20. The adhesive can be curable, for example, responsive to heat or electromagnetic radiation to cure and adhere the acoustic wave filter 70 to the support substrate 20. The adhesive can be a polymer or resin, for example SU8, and can be coated on the support substrate 20 or the acoustic wave filter 70 or the filter element 30, or provided as a laminate between the support substrate 20 and the acoustic wave filter 70 or filter element 30, or pattern-wise inkjet deposited on the support substrate 20 or the acoustic wave filters 30. In an embodiment, the adhesive layer 50 has an extent or area over the support substrate 20 that is different from the extent or area of the filter element 30 or acoustic wave filter 70. The extent is taken in a plane parallel to the surface 26 of the support substrate 20 on which the acoustic wave filter 70 or filter element 30 is micro-transfer printed. The adhesive can be patterned.

In embodiments of the present invention, the support substrate 20 can have two relatively flat and substantially parallel opposing sides and can be any structure having a process side 26 suitable for the deposition, processing, and patterning of active or passive electronic structures useful in forming patterned conductors or an active electronic circuit 22 and on which the acoustic wave filter 70 or filter element 30 can be micro-transfer printed. Such structures can include transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. The support substrate 20 can be glass, polymer, plastic, ceramic, semiconductor, or metal and can be rigid or flexible. For example, photolithographic processes for making integrated circuits or processing substrates can be employed with suitable semiconductor support substrates 20. The semiconductor support substrates 20 can include semiconductor materials such as silicon or compound semiconductor materials composed of two or more elements from different groups of the periodic table such as a III-V or II-VI semiconductor substrate. In an embodiment, the support substrate 20 is a crystalline semiconductor substrate, such as a crystalline silicon semiconductor in which circuits, such as CMOS circuits, can be formed using photolithographic processes. By using crystalline semiconductor substrate 30, better performance is achieved than, for example, might be found in a structure using amorphous or polycrystalline semiconductor materials.

According to embodiments of the present invention, the acoustic wave filter 70 and filter element 30 are micro-transfer printed onto the support substrate 20. As intended herein, to be micro-transfer printed upon means that separate substrates are separately produced and then brought into proximity using a transfer stamp and then adhered together. The acoustic wave filter 70 or filter element 30 and the support substrate 20 can be, for example, unpackaged bare die that are directly adhered together. As also intended herein, the acoustic wave filter 70 or filter element 30 micro-transfer printed on the support substrate 20 also means that the acoustic wave filter 70 or filter element 30 can be micro-transfer printed on or over the active electronic circuit 22 or additional conductive elements on or in the support substrate 20 or a layer on the active electronic circuit 22, for example the adhesive layer 50. To be micro-transfer printed on or adhered to the active electronic circuit 22 means that the acoustic wave filter 70 or filter element 30 is micro-transfer printed on or adhered to any of the elements of the active electronic circuit 22, for example upon a semiconductor layer, a patterned or doped semiconductor layer or structure, a conductor layer or patterned conductor, a dielectric layer, a patterned dielectric layer, a protective layer, or any other element of the active electronic circuit 22.

In contrast, as intended herein a layer formed on a semiconductor substrate, for example by evaporation, sputtering, or ion beam exposure, whether patterned or not or annealed or not, is not micro-transfer printed upon or adhered to a support substrate 20 but rather is fused or welded to the underlying layer. Such a structure does not include separate, independent, and distinct substrates, one mounted upon the other and is therefore distinct and different from the micro-transfer printing embodiments of the present invention. As used herein, separate, independent, and distinct substrates are separately constructed, optionally at different times and at different locations using at least some different processes and on different wafers. After they are constructed, the separate, independent, and distinct substrates can be transported and stored separately and independently. Methods of the present invention disclose micro-transfer printing one substrate (e.g., the filter element 30 or acoustic wave filter 70) onto another separate, independent, and distinct substrate (e.g., the support substrate 20) and electrically interconnecting them with the electrical conductors 40. The substrates remain separate, independent, and distinct after they are combined into a common structure, since the substrates themselves both remain present in the combined structure.

The active electronic circuit 22 is a circuit that includes at least one active component or element, for example a transistor, a diode, an amplifier, an oscillator, or a switch. Passive components such as conductors, patterned conductors, resistors, capacitors, and inductors can also be included in the active electronic circuit 22. Elements of the active electronic circuit 22 are electrically connected to circuit connection pads 24. The circuit connection pads 24 are portions of the active electronic circuit 22 that are also available to make electrical connections with electrical devices external to the active electronic circuit 22, for example such as controllers, power supplies, ground, or signal connections. Similarly, the filter connection pads 34 are portions of the electrodes 32 or electrically conductive areas electrically connected to the electrodes 32. The circuit connection pads 24 or filter connection pads 34 can be, for example, rectangular or circular areas of electrically conductive materials such as the conductors listed above, accessible or exposed to external elements such as wires or conductors, including the electrical conductors 40. The circuit connection pads 24 or filter connection pads 34 can have any shape conducive to the formation of electrical connections.

Figure 7:
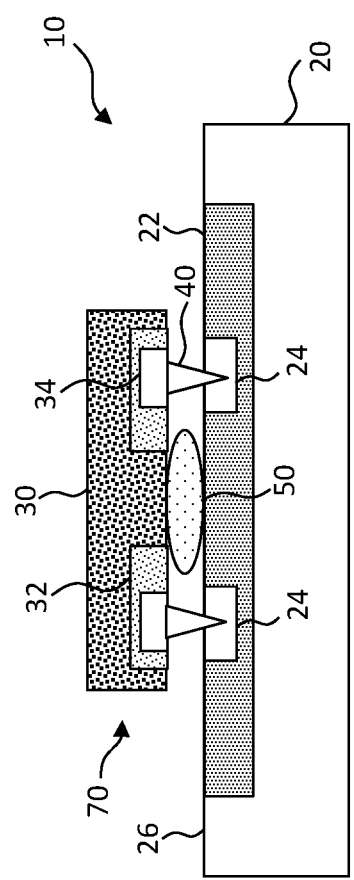
FIG. 7 is a cross section of an embodiment of the present invention having an acoustic wave filter with electrically connecting protrusions.

Electrical connections to the circuit connection pads 24 can be made using solder and solder methods, photolithographic processes, conductive ink deposition by inkjet, or by contacting and possibly penetrating the circuit connection pads 24 with electrically conductive protrusions or spikes formed in or on a device with another substrate separate, distinct, and independent from the support substrate 20 and connected to electrodes 32 in the other substrate (FIG. 7). The other substrate can be the piezoelectric filter element 30 and the electrically conductive protrusions or spikes can be the electrical conductors 40. Electrical connections between conductors or an active first circuit on a first substrate (e.g., the active electronic circuit 22 on the support substrate 20) and electrodes on a second substrate (e.g., the electrodes 32 on the filter element 30) can be made by mechanically pressing conductive protrusions on the second substrate 30 in alignment against, into, onto, or through circuit connection pads 24 on the first substrate 20 to form electrical interconnections without photolithographic processing and are described in U.S. patent application Ser. No. 14/822,864 entitled "Chiplets with Connection Posts" whose contents are incorporated by reference in its entirety. In an embodiment, the filter connection pads 34 can be the base of the electrically conductive protrusions or spikes.

As intended herein, the electrically conductive protrusions or spikes pressed into, onto, or through the circuit connection pads 24 are adhered to the circuit connection pads since the friction provided between the conductive protrusions or spikes and the circuit connection pads 24 causes them to adhere and the layer in which the conductive protrusions or spikes are pressed into, onto, or through the circuit connection pads is therefore an adhesive layer. Furthermore, in another embodiment, the adhesive layer 50, or a portion or pattern of the adhesive layer 50 can be provided in combination with the conductive protrusions or spikes to adhere the support substrate 20 to the acoustic wave filter 70, as shown in FIG. 7.

The piezoelectric filter element 30 can be any substrate or layer having piezoelectric properties and on or in which electrodes 32 can be formed. For example, the filter element 30 can include one or more of any of a semiconductor, a compound semiconductor, a III-V semiconductor, a II-VI semiconductor, a ceramic, a synthetic ceramic, GaN, AlGaN, gallium orthophosphate ($GaPO_4$), Langasite ($La_3Ga_5SiO_{14}$), lead titanate, barium titanate ($BaTiO_3$), lead zirconate titanate ($Pb[Zr_xTi_{1-x}]O_3$ $0 \leq x \leq 1$), potassium niobate ($KNbO_3$), lithium niobate ($LiNbO_3$), lithium tantalate ($LiTaO_3$), sodium tungstate ($Na_2WO_3$), $Ba_2NaNb_5O_5$, $Pb_2KNb_5O_{15}$, zinc oxide (ZnO), Sodium potassium niobate (($K,Na)NbO_3$) (NKN), bismuth ferrite ($BiFeO_3$), Sodium niobate (NaNbO), bismuth titanate ($Bi_4Ti_3O_{12}$), sodium bismuth titanate ($Na_{0.5}Bi_{0.5}TiO_3$), wurtzite, or polyvinylidene fluoride. The filter element 30 can be processed using photolithographic methods to form the electrodes 32 and can have two relatively flat and substantially parallel opposing sides. Alternatively, other methods such as micro-embossing and inkjet deposition can be used to form structures on the piezoelectric filter element 30. The piezoelectric filter element 30 can be crystalline. In an embodiment, the processing materials and methods of the filter element 30 and electrodes 32 are at least partially different from and incompatible with the processing materials and methods of the support substrate 20 or active electronic circuit 22.

The support substrate 20 and the filter element 30 can take a variety of forms, shapes, sizes, and materials. In one embodiment, the filter element 30 is thicker than the support substrate 20. In another embodiment, the filter element 30 is thinner than the support substrate 20, or the filter element 30 and the support substrate 20 can have the same thickness. The support substrate 20 can have a thickness less than 20 microns, less than 10 microns, or less than 5 microns. The filter element 30 can have a thickness less than 10 microns, less than 5 microns, or less than 1 micron. Alternatively, the filter element 30 can have a thickness greater than 0.5 microns, greater than 1 micron, greater than 2 microns, or greater than 5 microns. Such a variety of sizes can enable highly integrated and small structures useful in a corresponding variety of electronic systems.

Referring again to FIG. 2, in an embodiment of the present invention, the electrodes 32 form transducers 36 in cooperation with the filter element 30. The filter connection pads 34 are available to make electrical connections with electrical devices external to the filter element 30, for example signal connections to the active electronic circuit 22. Electrical connections to the filter connection pads 34 can be made using solder and soldering methods or photolithographic processes. Alternatively, the filter connection pads 34 can be electrically connected to electrically conductive protrusions or spikes that extend from the filter element 30 to form the electrical conductors 40 and can be pressed against the circuit connection pads 24 on the support substrate 20 to form an electrical connection between the electrodes 32 and the circuit connection pads 24, as described above and illustrated in FIG. 7.

As shown in FIG. 1C, the electrodes 32 can be patterned and arranged on a common side of the filter element 30 to form capacitors having interdigitated projections or fingers that, upon the application of a dynamic voltage differential across the terminals of the capacitor, forms a corresponding dynamic electrical field that causes a surface acoustic wave 60 to form in the piezoelectric filter element 30 or that responds to the surface acoustic wave 60 in the piezoelectric filter element 30 and forms a voltage differential across the terminals of the capacitor. Alternatively, as shown in FIG. 2, the electrodes 32 form conductive areas on opposite sides of the filter element 30 defining a capacitor. Upon the application of a dynamic voltage differential across the terminals of the capacitor, a corresponding dynamic electrical field is formed in the filter element 30 that causes a bulk acoustic wave 60 to form in the piezoelectric filter element 30. Thus, the electrodes 32 are patterned or disposed to form an electrical or magnetic field when an electrical potential is applied to the electrodes 32. The electrodes 32 can comprise one or more capacitors and, in cooperation with the filter element 30, comprise one or more transducers (e.g., a single transducer in FIG. 2 and first and second transducers 36, 38 in FIG. 1C).

A transducer converts energy in one form to energy in another form. For example, the first transducer 36 converts electrical energy (an electrical current in the electrodes 32) into an electrical field across the interdigitated fingers of the capacitor or through the filter element 30 and then into surface or bulk acoustic waves 60 in the piezoelectric filter element 30. In the embodiment of FIG. 1C, the second transducer 38 does the reverse by converting an acoustic wave (a mechanical vibration for example in a crystal lattice) into an electrical field across the interdigitated fingers of a capacitor that induces an electrical current in the electrodes 32.

Referring again to FIG. 2, in an embodiment of the present invention, an acoustic mirror layer 35 is located at least partially on a side of one of the electrodes 32 opposite the filter element 30 with the filter element 30 between the support substrate 20 and the acoustic mirror layer 35. Alternatively, an acoustic mirror layer 35 is located on a side of one of the electrodes 32 opposite the filter element 30 with the acoustic mirror layer 35 between the support substrate 20 and the filter element 30. In another embodiment, an acoustic mirror layer 35 is disposed in both locations. In a further embodiment discussed further below with respect to FIG. 9L, at least one of the acoustic mirror layers 35 is chemically etch-resistant or at least one of the electrodes 32 is chemically etch resistant.

Figure 3:
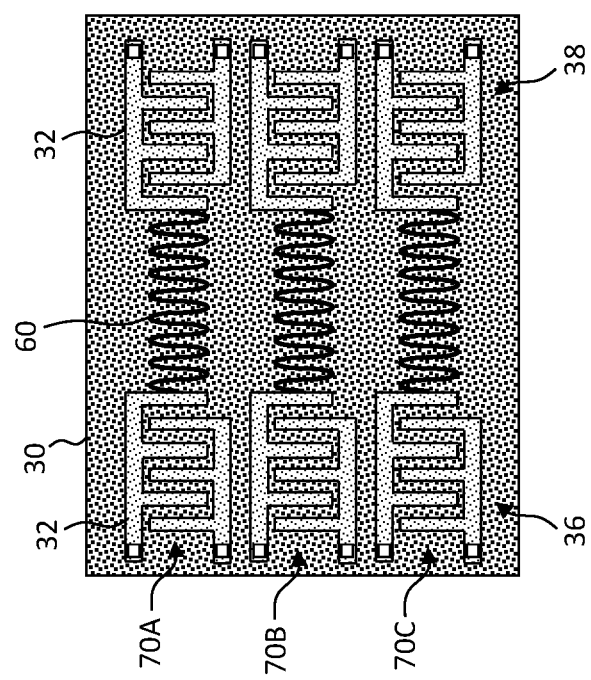
FIG. 3 is a schematic plan view of a filter substrate and a plurality of acoustic wave filters with a common piezoelectric layer according to another embodiment of the present invention.

Referring to FIG. 3, in an embodiment of the present invention, the electrodes 32 form a plurality of electrode pairs. Each electrode pair forms a separate transducer 36 formed on or in the filter element 30, corresponding to the embodiment of FIG. 1C. Pairs of transducers 36, 38 form individual surface acoustic wave filters 70A, 70B, 70C on a common filter element 30. Each of the electrodes 32 is connected to a circuit and a filter connection pad 24, 34 and to the active electronic circuit 22 with the electrical conductors 40. Thus, multiple acoustic wave filters 70A, 70B, 70C can be provided in a common filter element 30 and electrically connected to a common active electronic circuit 22 to provide multiple filtering operations. Multiple acoustic wave filters 70 electrically connected to a common set of conductors on the support substrate 20 or to a common active electronic circuit 22 can improve the integration density of the compound acoustic wave filter device 10 of the present invention.

Figure 4:
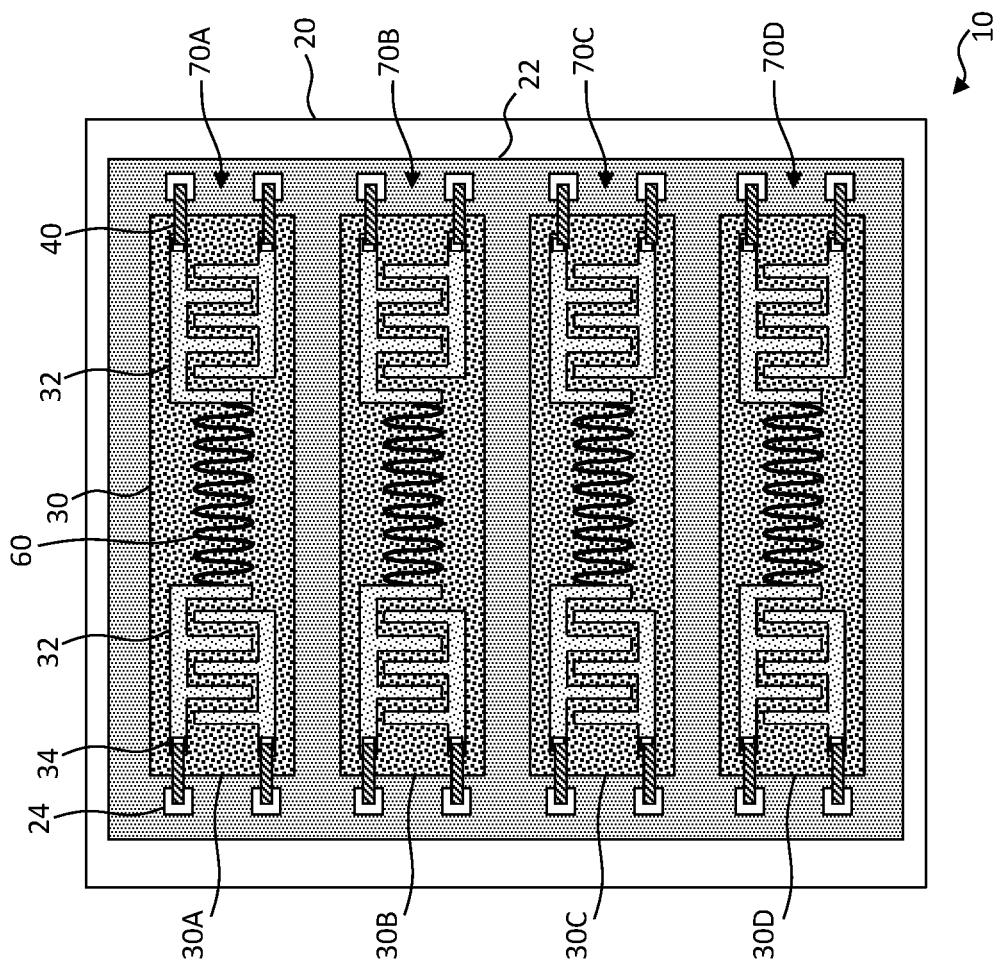
FIG. 4 is a schematic plan view of a plurality of filter substrates and a plurality of corresponding acoustic wave filters with distinct, separate and independent piezoelectric layers on a support substrate according to yet another embodiment of the present invention.

In another embodiment of the present invention illustrated in FIG. 4, a plurality of acoustic wave filters 70A, 70B, 70C, 70D each having a separate, distinct, and independent piezoelectric filter element 30 (filter element 30A, filter element 30B, filter element 30C, and filter element 30D) and two or more electrodes 32, is micro-transfer printed onto or over the support substrate 20. The plurality of filter elements 30 can have reduced acoustic wave cross talk and improved performance compared to the embodiment of FIG. 3. The electrodes 32 of each of the filter elements 30A, 30B, 30C, 30D are connected to corresponding circuit connection pads 24 and filter connection pads 34 with one or more of the electrical conductors 40. Although the acoustic wave filters 70A, 70B, 70C, 70D are illustrated in FIG. 4 as surface acoustic wave filters 70A, 70B, 70C, 70D corresponding to FIG. 1C, in another embodiment the acoustic wave filters 70A, 70B, 70C, 70D are bulk acoustic wave filters 70A, 70B, 70C, 70D, each corresponding to the bulk acoustic wave filter 70 of FIG. 2.

In an embodiment of the present invention, all of the acoustic wave filters 70A, 70B, 70C, 70D are substantially identical. In another embodiment, some of the acoustic wave filters 70 are different from others. For example, a first acoustic wave filter 70A of the plurality of acoustic wave filters 70 has one or more first attributes, a second acoustic wave filter 70B of the plurality of acoustic wave filters 70 has one or more second attributes and at least one of the first attributes is different from at least one of the second attributes. Attributes can include filter element material, crystal lattice structure, impedance at a pre-determined frequency, or size, such as thickness, length, or width. Attributes can also include placement of electrodes, electrode material, electrode material composition or structure, or electrode size, such as thickness, length, or width. For example, in one embodiment a first acoustic wave filter 70A can have a low impedance at a desired frequency and a second acoustic wave filter 70A can have a high impedance at the desired frequency.

In an embodiment of the present invention, the different acoustic wave filters 70 are formed on a common acoustic wave filter source wafer 12, for example using photolithographic processes, or from a plurality of substantially identical acoustic wave filter source wafers 12. In another embodiment, multiple, different acoustic wave filter source wafers 12 are provided having different acoustic wave filters 70 on them. For example, a first acoustic wave filter wafer 12 has first acoustic wave filters 70A, a second acoustic wave filter wafer 12 has second acoustic wave filters 70B, and both the first and second acoustic wave filters 70A, 70B from the respective first and second acoustic wave filter wafers 12 are micro-transfer printed onto the adhesive layer 50. The acoustic wave filter source wafers 12 can be different and the acoustic wave filters 70 from the different acoustic wave filter source wafers 12 can be different, for example having different materials, crystal lattice structures, sizes, or electrodes. By using different acoustic wave filter source wafers 12, the task of tuning the filter elements 30 is greatly simplified, since the filter elements 30 can be made separately using different materials or structures and independently optimized for their desired characteristics.

Figure 10:
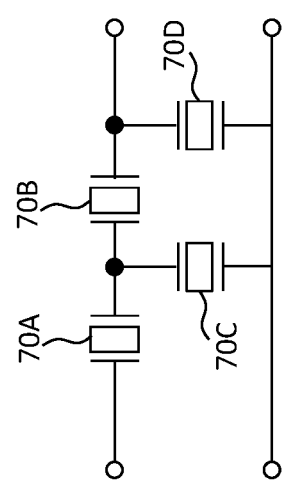
FIG. 10 is a diagram illustrating the use of a plurality of acoustic wave devices in a common circuit according to an embodiment of the present invention.

Referring to FIG. 10, a network of acoustic wave filters 70A, 70B, 70C, 70D are electrically connected to form an RF filter useful for telecommunications applications. The acoustic wave filters 70A, 70B, 70C, 70D of FIG. 10 can correspond to the acoustic wave filters 70A, 70B, 70C, 70D of FIG. 4. The acoustic wave filters 70A, 70B, 70C, 70D can be different acoustic wave filters 70 from different source wafers 12 can have different attributes. Thus, in an embodiment of the present invention, the filter structure illustrated in FIG. 10 can be constructed on a common support substrate 20 and electrically connected to a common set of conductors on the support substrate 20 or to a common active electronic circuit 22. Such an integrated compound acoustic wave filter device 10 can be very small, for example having a length or breadth dimension of less than or equal to 1 mm, less than or equal to 800 µm, less than or equal to 600 µm, less than or equal to 400 µm, less than or equal to 200 µm, less than or equal to 100 µm, less than or equal to 50 µm, or less than or equal to 20 µm. The height of the compound acoustic wave filter device 10 can be less than or equal to 100 µm, less than or equal to 50 µm, less than or equal to 20 µm, less than or equal to 10 µm, less than or equal to 5 µm, or less than or equal to 2 µm. The support substrate 20 likewise can have a length or breadth dimension of less than or equal to 1 mm, less than or equal to 800 µm, less than or equal to 600 µm, less than or equal to 400 µm, less than or equal to 200 µm, less than or equal to 100 µm, less than or equal to 50 µm, or less than or equal to 20 µm. The compound acoustic wave filter device 10 can be a surface-mount device.

In an embodiment of the present invention the support substrate 20 or the filter element 30, or both, are chiplets. Chiplets can be small integrated circuits or processed substrates, for example bare die, that are integrated into a compound device structure using micro-transfer printing. In an embodiment, the acoustic wave filter 70 or filter element 30 is not an integrated circuit with active circuit components but rather a small substrate processed using photolithographic methods to provide passive elements such as electrodes 32 and filter connection pads 34 thereon. Alternatively, the filter element 30 is an integrated circuit with active circuit components. The compound acoustic wave filter device 10 can be subsequently packaged after integrating the support substrate 20 with the acoustic wave filter 70 using micro-transfer printing. In various embodiments, the support substrate 20, acoustic wave filter 70, or the filter element 30 has a width from 2 to 5 µm, 5 to 10 µm, 10 to 20 µm, or 20 to 50 µm, the support substrate 20 acoustic wave filter 70, or the filter element 30 has a length from 2 to 5 µm, 5 to 10 µm, 10 to 20 µm, or 20 to 50 µm, or the support substrate 20 acoustic wave filter 70, or the filter element 30 has a height from 2 to 5 µm, 4 to 10 µm, 10 to 20 µm, or 20 to 50 µm. Such small substrate elements provide a high degree of integration and consequently reduced manufacturing costs and improved performance.

Figure 5:
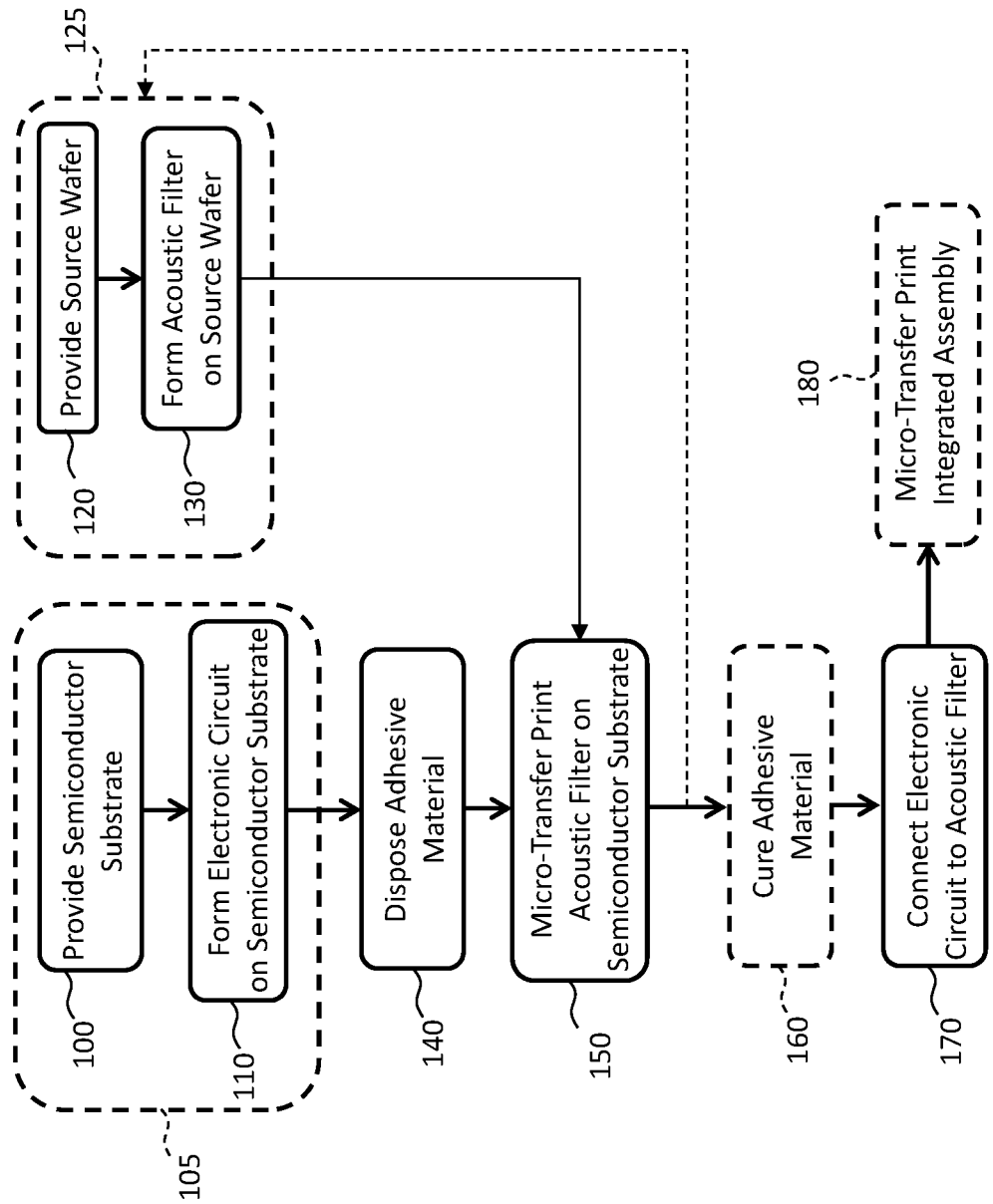
FIG. 5 is a flow diagram illustrating a method of the present invention.

Referring to FIG. 5, a method of making a compound acoustic wave filter device 10 includes providing a support substrate 20. In the FIG. 5 illustration, the support substrate 20 is a semiconductor substrate with active electronic components. In another embodiment (FIG. 8), the support substrate 20 is a passive substrate, for example including only electrical conductors and connection pads (not shown in FIG. 8). The semiconductor substrate 20 has an active electronic circuit 22 formed in or on the support substrate 20 in step 105. Alternatively, the support substrate 20 can first be provided in step 100 and the active electronic circuit 22 formed in or on the support substrate 20 in step 110. The active electronic circuit 22 includes one or more circuit connection pads 24 connected to the active electronic circuit 22 for providing signals to the active electronic circuit 22 or receiving signals from the active electronic circuit 22. A piezoelectric filter element 30 separate, distinct, and independent from the support substrate 20 is provided in step 120 and electrodes 32 formed in or on the filter element 30 in step 130 to form an acoustic wave filter 70. The acoustic wave filter 70 includes one or more transducers 36 for converting an electrical signal to an acoustic wave 60 in or on the filter element 30. Alternatively, a first transducer 36 converts a first electrical signal to an acoustic wave 60 in or on the filter element 30 and a second transducer 38 converts the acoustic wave 60 to a second electrical signal different from the first electrical signal. In another embodiment, the filter element 30 and electrodes 32 are provided in a single step 125. In one embodiment of the present invention, step 130 provides a plurality of acoustic wave filters 70 on a single filter element 30 (e.g., corresponding to the structure of FIG. 3), for example by providing four or more electrodes 32 on the filter element 30 forming two or more acoustic wave filters 70. Alternatively or in addition, step 125 is repeated to provide a plurality of acoustic wave filters 70 on separate filter elements 30 (e.g., corresponding to the structure of FIG. 4).

A layer 50 of adhesive is disposed between the filter element 30 and the support substrate 20 in step 140, for example on the filter element 30 or acoustic save filter 70, on the support substrate 20, or with a laminate located between the filter element 30 and the support substrate 20. The adhesive can be a patterned layer 50 of adhesive, for example inkjet-deposited adhesive material, provided by coating, or patterned using photolithography. The filter element(s) 30 or acoustic wave filter(s) 70 are mounted on the support substrate 20 in step 150 by micro-transfer printing. In an alternative embodiment, step 150 is repeated to provide a plurality of filter elements 30 or acoustic wave filter(s) 70 micro-transfer printed on the support substrate 20 (e.g., corresponding to the structure of FIG. 4). The adhesive can be a curable adhesive and in step 160 the adhesive layer 50 is cured to adhere the acoustic wave filter 70 or filter element 30 to the support substrate 20. One or more electrodes 32 are connected to the circuit connection pads 24 or the active electronic circuit 22 or additional conductive elements on the support substrate 20 (if present) through the filter connection pads 34, electrical conductors 40, and circuit connection pads 24 for providing the first electrical signal to the first transducer 36 and for receiving the second electrical signal from the second transducer 38 (if present) in step 170 to construct a compound acoustic wave filter device 10 of the present invention. This step can be provided using photolithographic deposition and patterning of conductive materials or patterned deposition of conductive materials. Alternatively, the step 170 of connecting the circuit connection pads 34 (or active electronic circuit 22, if present) to the filter connection pads 34 and electrodes 32 can be performed in a common step with the micro-transfer step 140 using the conductive protrusions or spikes illustrated in FIG. 7 and described above so that no separate step 170 is necessary.

The integrated assembly can be a surface-mount device. In optional step 180, the integrated compound acoustic wave filter device 10 is itself micro-transfer printed to a system substrate (for example, a printed circuit board, glass, or polymer substrate) as part of a compound micro-assembly structure and process. Alternatively, other methods such as pick-and-place can be used, or surface-mount techniques can be used to dispose the integrated compound acoustic wave filter device 10 to a desired location, for example as part of a larger RF circuit or substrate.

In a further embodiment of the present invention, electrical conductors 40 are electrically conductive protrusions or spikes extending from the filter element 30 or acoustic wave filter 70 and the step 150 of micro-transfer printing the filter element 30 or acoustic wave filter 70 onto the support substrate 20 includes pressing the electrically conductive protrusions or spikes against, onto, into, or through the circuit connection pads 24 to form an electrical connection between the electrodes 32 and the circuit connection pads 24, as also illustrated in FIG. 7. As noted above, an adhesive layer 50 or patterned adhesive layer 50 can be used in combination with the conductive protrusions or spikes to provide electrical connections and adhesion between the acoustic wave filter 30 and support substrate 20.

Figure 9A:
Figure 9B:
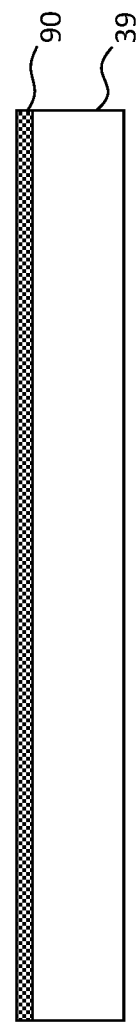

Referring to FIG. 6, to FIGS. 9A-9M, and to FIG. 2, in another embodiment of the present invention, a method of making a compound acoustic wave filter device 10 includes providing a support wafer 39 in step 200 and as shown in FIG. 9A. The support wafer 39 provides a support substrate and can be a glass wafer, a dielectric, a metal wafer, a semiconductor wafer, a polymer wafer, a combination of these, or any wafer suitable for material deposition or photolithographic processing. Referring to FIG. 9B, an optional buffer layer 90 is deposited on the support wafer 39 in optional step 205. The optional buffer layer 90 includes a material selected to enable subsequent removal of the support wafer 39 and to provide a surface on which a piezoelectric layer 30 forming a filter element 30 can be formed. The buffer layer can be a piezo material nucleation layer that reduces lattice mismatch between the support wafer 39 and the filter element 30, and can include, for example, silicon nitride or aluminum nitride deposited by vapor deposition. Since the filter element 30 can be crystalline, lattice mismatch between the filter element 30 and the support wafer 39 can increase defects within the filter element 30 and reduce the performance of the acoustic wave filter 70.

Figure 9C:
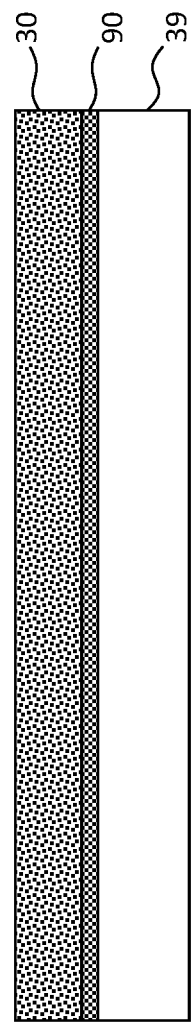

In step 210 illustrated in FIG. 9C, the piezoelectric layer 30 is formed, for example by vapor deposition or other material deposition methods (e.g. chemical vapor deposition, sputtering, or atomic layer deposition) and, in an embodiment, forms a crystalline layer. Suitable piezoelectric filter layer 30 materials are listed above.

Figure 6:
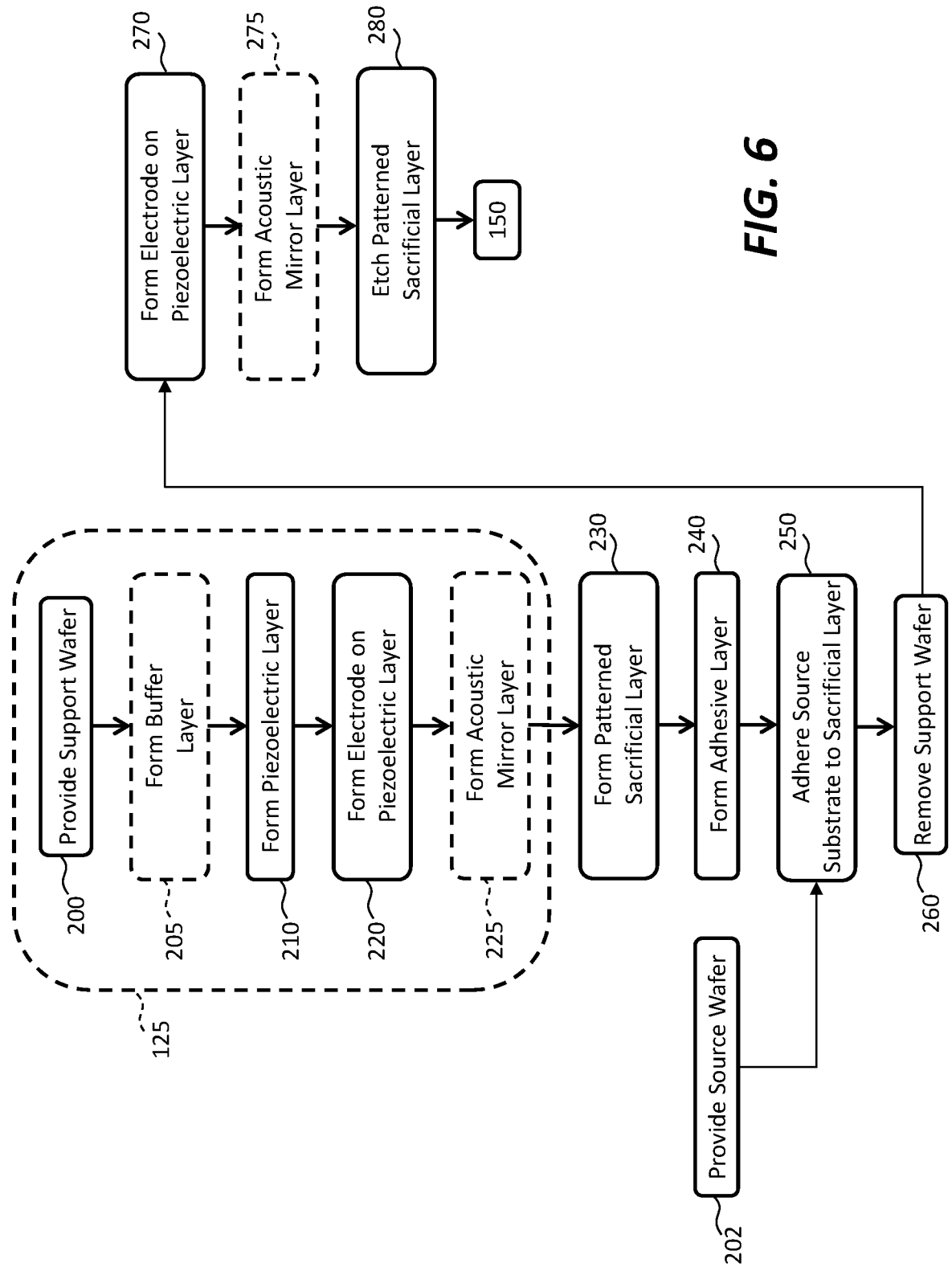
FIG. 6 is another flow diagram illustrating another method of the present invention.
Figure 9D:
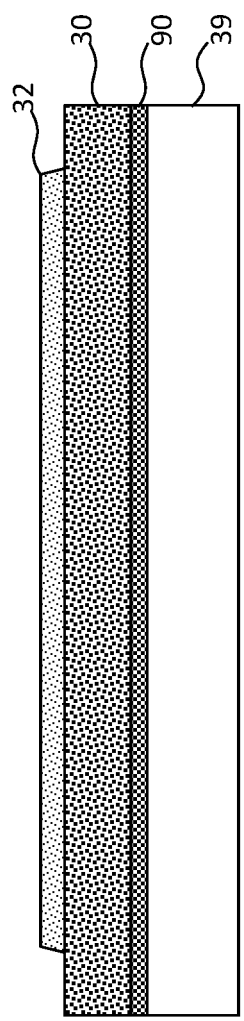

Referring next to FIG. 9D and step 220 of FIG. 6, an electrode 32 is formed on the piezoelectric layer 30 and can be patterned, if desired, using photolithographic processes, for example to form the capacitive structures illustrated in FIG. 1C. The electrodes 32 can be a metal, for example tantalum, molybdenum, platinum, titanium, gold, silver, aluminum, tungsten, combinations of such metals, or metal oxides, for example indium tin oxide or aluminum zinc oxide.

Figure 9E:
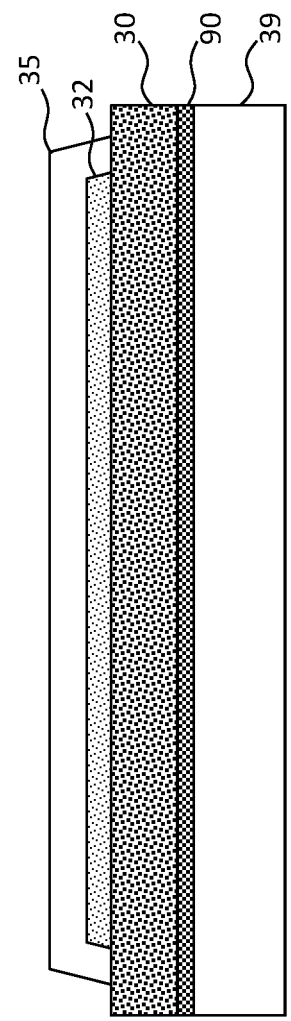

Referring next to FIG. 9E and optional step 225 of FIG. 6, an optional acoustic mirror layer 35 is formed on the electrode 32 and optionally on the piezoelectric layer 30 and can be patterned, if desired, using photolithographic processes. In an embodiment, a portion of the electrode 32 is not covered by the optional acoustic mirror layer 35 (not shown in FIG. 9E). The acoustic mirror layer 35 can include sub-layers, for example alternating layers of low-impedance (e.g., dielectric) and high-impedance (e.g., metal) reflector layers (for example quarter-wave thickness) chosen to constructively and destructively interfere with the acoustic waves generated in the filter layer 30 and thereby improve the performance of the acoustic wave filter 70.

Figure 9F:
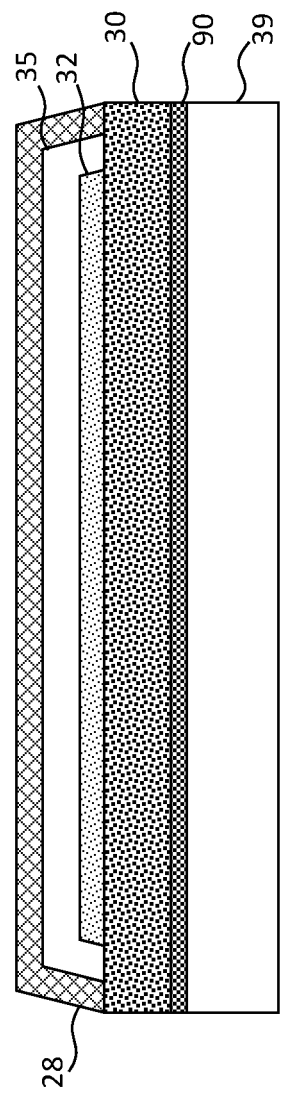
Figure 9G:
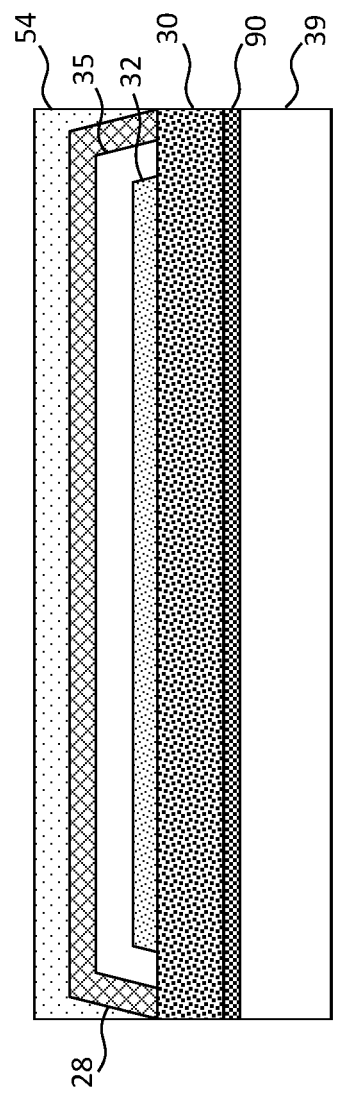

In step 230 of FIG. 6 and referring to FIG. 9F, a sacrificial layer 28 is patterned over the optional acoustic mirror layer 35 and electrode 32 to form sacrificial portions (as labeled 28). The patterned sacrificial layer 28 can be etched to remove the material of the sacrificial portions 28 to form a gap between the acoustic wave filter 70 and the support substrate 20. The patterned sacrificial layer 28 can be a patterned layer of etchable material, for example an oxide such as silicon dioxide. FIG. 9G illustrates disposing an adhesive layer 54 on the patterned sacrificial layer 28 in step 240.

Referring next to step 202 of FIG. 6, a source wafer 29 (also referred to as a handle wafer in this process) is provided. The source/handle wafer 29 can be glass, polymer, metal, or a semiconductor wafer. As shown in FIG. 9H, in step 250 the source/handle wafer 29 is adhered to the adhesive layer 54 and, in step 260 the support wafer 39 and optionally the optional buffer layer 90 are removed, for example by grinding or by chemically etching the optional buffer layer 90 to detach the support wafer 39. As shown in FIG. 9I, the structure can be turned over or otherwise arranged to provide a process surface on the filter layer 30.

For clarity, FIG. 9J and the subsequent FIGS. 9J-9M have a larger horizontal scale. Referring to FIG. 9J, a second electrode 32 is optionally formed and patterned on the filter element 30 in step 270 and an optional second acoustic mirror layer 35 formed over the electrode 32 in step 275 to form a bulk acoustic wave filter 70. The filter element 30 is processed to expose the patterned sacrificial layer 28, optional dielectric insulators 52 are patterned to insulate the filter element 30, if necessary, and filter connection pads 34 are formed (FIG. 9K). In alternative embodiments, the filter connection pads 34 are formed before or after the electrodes 32 are formed, the second acoustic mirrors 35 are formed, or the filter layer 30 is processed or patterned.

Thus, in an embodiment of the present invention, an acoustic wave filter wafer 12 includes a source wafer 29 of substrate material having a patterned sacrificial layer 28 forming sacrificial portions 28 on, over, or in the substrate material, a surface of the substrate material, the source wafer 29, or a surface of the source wafer 29. The sacrificial portions 28 define separate anchors 92 between the sacrificial portions 28. A piezoelectric acoustic wave filter 70 is formed entirely over each sacrificial portion 28. The acoustic wave filter 70 includes at least (i) a layer 30 of piezoelectric material and (ii) two or more electrodes 32 in or on the piezoelectric material layer 30. The portion of each acoustic wave filter 70 in contact with the sacrificial portion 28 is chemically and selectively etch-resistant so that the contact portion has a chemical selectivity different from the patterned sacrificial layer 28. The contact portion can be a portion of the piezoelectric filter layer 30 or all of or a portion of an electrode 32. In an embodiment in which one or more acoustic mirror layers 35 are present, the contact portion can be all of or a portion of an acoustic mirror layer 35. Because the contact portion has a chemical selectivity different from the patterned sacrificial layer 28, the sacrificial portions 28 can be etched without undue damage to whatever portion of the acoustic wave filter 70 is in contact with the sacrificial portions 28, for example any or all of the piezoelectric filter layer 30, the electrode 32, or the acoustic mirror layer 35.

Figure 12:
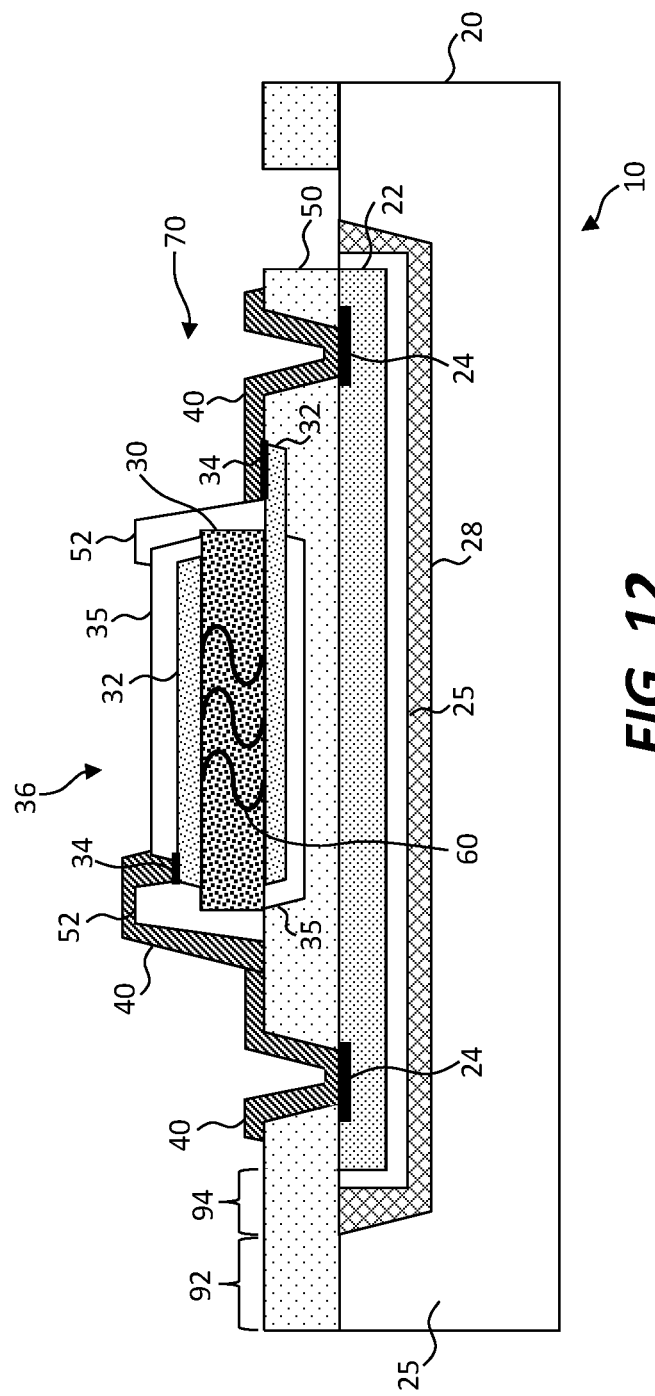
FIG. 12 is a cross section illustrating a compound acoustic filter wafer and micro-transfer printable device of the present invention.

By etching the patterned sacrificial layer 28 in step 280, a tether 94 is formed physically connecting the anchor 92 and the acoustic wave filter 70. Thus, the piezoelectric acoustic wave filter 70 is attached to the anchor 92 with at least one tether 94. The sacrificial portions 28 then form a gap between the acoustic wave filter 70 and the source/handle wafer 29 so that the acoustic wave filter 70 can be micro-transfer printed in step 150 onto adhesive layer 50 disposed on or over the support substrate 20 as described with respect to FIG. 5 and as illustrated in FIG. 9L. The adhesive layer 50 is then cured (step 160) and patterned (FIG. 9M), so that the electrical conductors 40 can be formed (step 170) electrically connecting the active electronic circuit 22 to the electrode 32 (FIG. 2) to form the compound acoustic wave filter device 10 of the present invention. Those knowledgeable in the photolithographic arts will recognize that various elements and layers can be formed or processed at different times or in different orders than as described in the example of FIGS. 9A-9M. The compound acoustic wave filter device 10 can be a surface-mount device and be disposed in a circuit on another substrate such as in an RF circuit on a printed circuit board. Alternatively, the support substrate 20 can itself have a sacrificial layer formed, for example under the active electronic circuit 22 if present, that can be etched to provide a micro-transfer printable compound acoustic wave filter device 10, as described below with respect to FIG. 12.

Figure 8:
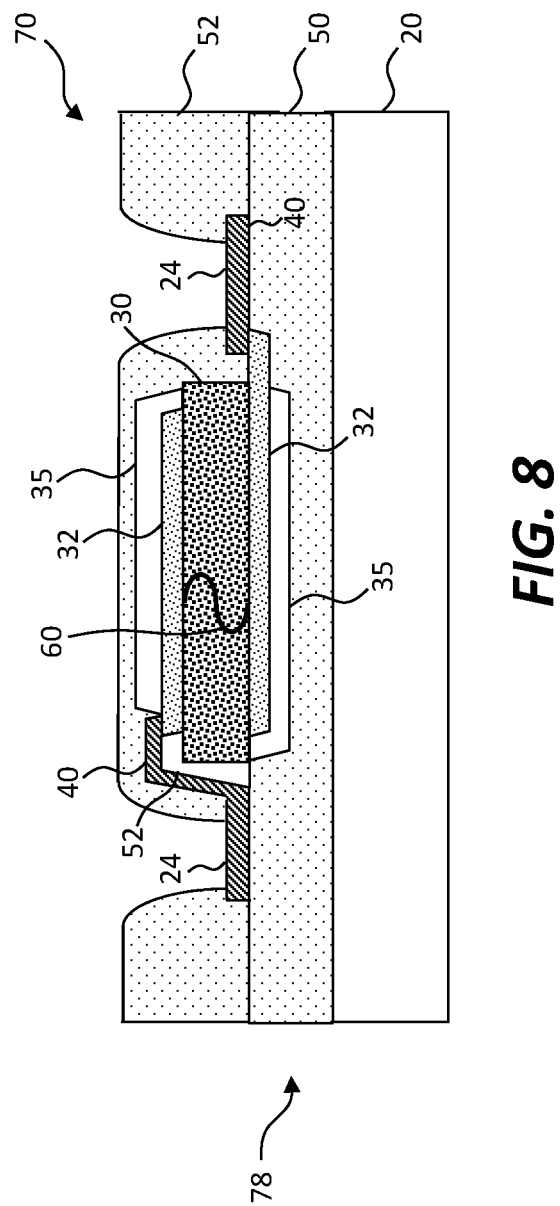
FIG. 8 is a cross section of a surface-mount embodiment of the present invention.

In another embodiment of the present invention and in reference to FIG. 8, the acoustic wave filter 70 is micro-transfer printed onto a passive support substrate 20. The electrical conductors 40 are formed and a dielectric layer 52 is patterned and expose circuit connection pads 24 to provide a surface-mount device 78 that can be surface mounted and electrically connected in a circuit. The support substrate 20 can be a passive substrate that includes conductive wires or circuit connection pads 24 but does not include active electronic elements such as transistors or diodes.

Figure 11C:
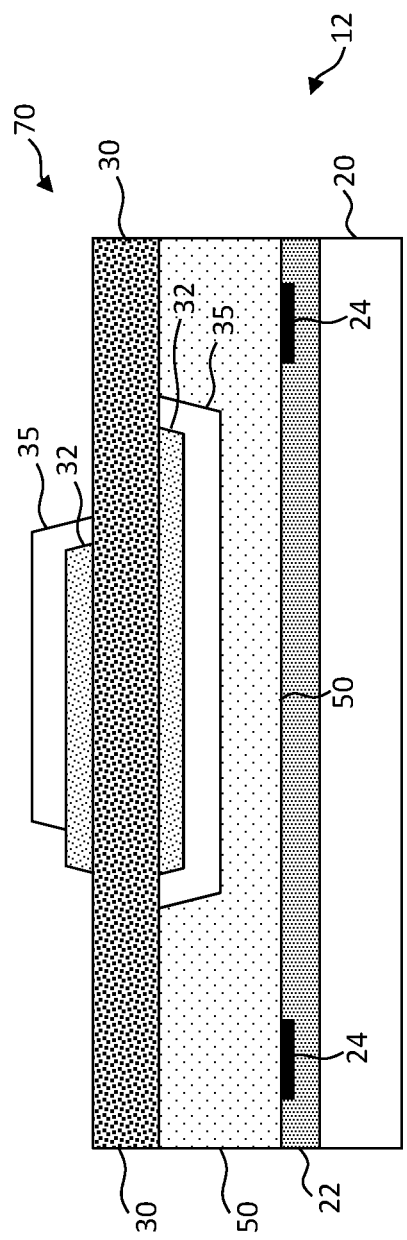

Referring to FIGS. 11A-11C, in another method of the present invention, the sacrificial layer 28 is not formed (FIG. 9F, step 230). Instead, the support substrate 20, active electronic circuit 22, and circuit connection pads 24 are adhered to the adhesive layer 54 instead of the source/handle wafer 29 (step 250) as shown in FIG. 11A and the support wafer 39 and optional buffer layer 90 are removed (FIG. 11B). In this embodiment, the second electrodes 32 and optional second mirror layer 35 are formed and patterned directly over the support substrate 20 (FIG. 11C), and the process then continues as described with reference to FIGS. 9L and 9M. This avoids the etching process for the individual acoustic wave filters 70. This approach is particularly useful if the compound acoustic wave filter device 10 itself is a micro-transfer printable device. In this case, referring to FIG. 12, a sacrificial layer 28 is provided in the support substrate 20 under the active electronic circuit 22 or additional conductive elements, if present and as shown, and etched to form a micro-transfer printable compound acoustic wave filter device 10 using compound micro-assembly methods.

Embodiments of the compound acoustic wave filter device 10 of the present invention integrate substrates made of different materials, for example, different semiconductor materials or a semiconductor material and a ceramic. Such integrations of different substrate materials are heterogeneous and combine structures including different types of elements or different materials (particularly substrate materials) in a compound structure. For example, referring to FIGS. 1A, 1B, and 2, methods and structures of the present invention can include a first substrate 20 comprising a first material. An active first circuit 22 is formed in or on the first substrate 20, the active first circuit 22 including one or more first connection pads 24 connected to the active first circuit 22 for providing signals to the active first circuit 22 or receiving signals from the active first circuit 22. A second substrate 30 separate, distinct, and independent from the first substrate 20 includes a second material different from the first material and is mounted on the first substrate 20 using, for example, micro-transfer printing. The electrodes 32 or a second circuit is formed in or on the second substrate 30 and includes one or more second connection pads 34 connected to the electrodes 32 for providing signals to the electrodes 32 or second circuit or receiving signals from the electrodes 32 or second circuit. One or more electrical conductors 40 electrically connect one or more of the first connection pads 24 to one or more of the second connection pads 34. In other embodiments, a plurality of the electrodes 32 or second circuits are formed on or in the second substrate 30 and the first connection pads 24 are connected to the second connection pads 34 of the plurality of electrodes 32 with the one or more electrical conductors 40. Alternatively, a heterogeneous device of the present invention includes a plurality of the separate, distinct, and independent second substrates 30 mounted on the first substrate 20 and the first connection pads 24 are connected to the second connection pads 34 of the plurality of second substrates 30 with the one or more electrical conductors 40.

In an embodiment of the present invention, the one or more electrical conductors 40 are electrically conductive protrusions or spikes extending from the second substrate 30 in electrical contact with the first connection pads 24.

In an embodiment of the present invention, the second substrate 30 is mounted directly on or adhered directly to the first substrate 20 or on the active first circuit 22 formed on or in the first substrate 20. Thus, the active first circuit 22 can be located at least partially between the second substrate 30 and at least portions of the first substrate 20. The second substrate 30 can be adhered to the first substrate 20 with a layer 50 of adhesive, for example a curable adhesive such as SU8. The first substrate 20 can include multiple layers of different materials, either patterned or unpatterned.

The first or second substrates 20, 30 can be chiplets, small integrated circuits or processed substrates suitable for micro-transfer printing. In various embodiments, the first substrate 20 or the second substrate 30 has a width from 2 to 5 µm, 5 to 10 µm, 10 to 20 µm, or 20 to 50 µm, the first substrate 20 or the second substrate 30 has a length from 2 to 5 µm, 5 to 10 µm, 10 to 20 µm, or 20 to 50 µm, or the first substrate 20 or the second substrate 30 has a height from 2 to 5 µm, 4 to 10 µm, 10 to 20 µm, or 20 to 50 µm. Such small substrate elements provide a high degree of integration and consequently reduced manufacturing costs and increased performance.

A method of making a heterogeneous device similar to the method illustrated in FIG. 5 includes: providing a first substrate 20 with an active first circuit 22 formed in or on the first substrate 20, the active first circuit 22 including one or more first connection pads 24 connected to the active first circuit 22 for providing signals to the active first circuit 22 or receiving signals from the active first circuit 22 in step 105. A second substrate 30 separate, distinct, and independent from the first substrate 20 having electrodes 32 or a second circuit formed in or on the second substrate 30 and one or more second connection pads 34 connected to the electrodes 32 for providing signals to or receiving signals from the second circuit is provided in step 125. Adhesive is provided between the first and second substrates 20, 30 in step 140, the second substrate 30 is mounted upon the first substrate 20 in step 150 (e.g., by micro-transfer printing), and one or more of the first connection pads 24 is electrically connected to one or more of the second connection pads 34 in step 170.

In further embodiments, step 130 provides a plurality of the electrodes 32 or second circuits on the second substrate 30 and the one or more second connection pads 34 of each of the second circuits are electrically connected to the one or more first connection pads 24. Alternatively, or in addition, a plurality of second substrates 30 is provided and the plurality of second substrates 30 is mounted on the first substrate 20 using micro-transfer printing (step 150). One or more of the second connection pads 34 of each of the second substrates 30 are electrically connected to one or more of the first connection pads 24 to electrically connect the active first circuit 22 to the electrodes 32 or the second circuit (step 170). The second substrate 30 can be adhered to the first substrate 20 by disposing an adhesive layer 50 in step 140 between the first and second substrates 20, 30 and curing the layer 50 of adhesive, if necessary, in step 160.

In a further embodiment, the second connection pads 34 are electrically conductive protrusions or spikes extending from the second substrate 30 and the second substrate 30 is mounted on the first substrate 20 by pressing the electrically conductive protrusions or spikes against or into the first connection pads 24 (e.g., by micro-transfer printing) to form an electrical connection between the second circuit and the active first circuit 22 so that the electrically conductive protrusions or spikes form the one or more electrical conductors 40. As noted above, an adhesive layer 50 or patterned adhesive layer 50 can be used in combination with the conductive protrusions or spikes to provide electrical connections and adhesion between the first substrate 20 and second substrate 30.

In operation, the compound acoustic wave filter device 10 or heterogeneous device 10 is operated by providing electrical signals from a controller (not shown) through circuit (first) connection pads 24 to activate the active electronic (first) circuit 22 on the semiconductor (first) substrate 20. The active electronic (first) circuit 22 can further process the signals or communicate the signals, or both, to the electrodes 32 or second circuit on the filter (second) substrate 30 through the circuit (first) connection pads 24, the electrical conductor 40, and the filter (second) connection pads 34. The electrodes 32 communicate or the second circuit processes the communicated signals and provides the processed signal through the filter (second) connection pads 34, the electrical conductors 40, and the circuit (first) connection pads 24 to the active electronic (first) circuit 22. The active electronic (first) circuit 22 can further process the signals and enable actions or communicate the signals to the controller.

A plurality of the electrodes 32 can be made in an acoustic wave filter wafer 12 comprising the material of the filter element 30. As shown in FIG. 9K, sacrificial layers 28 or sacrificial portions 28, tethers 94, and anchors 92 can be formed between the electrodes 32 and the acoustic wave filter wafer 12 to form individual filter elements 30, each filter element 30 having one or more electrodes 32, and render the filter elements 30 micro-transfer printable. Similarly, an array of the active electronic circuits 22 can be made in a crystalline semiconductor wafer, for example, a silicon wafer such as silicon (1 0 0) or silicon (1 1 1). The filter elements 30 can be micro-transfer printed on the semiconductor substrates 20 (the semiconductor wafer) and the electrodes 32 and active electronic circuit 22 electrically connected with the electrical conductors 40. The integrated micro-transfer printed assembly can be used in a system as it is or the semiconductor wafer can be diced and optionally packaged, for example to form surface-mount devices, and disposed as desired in a system. Alternatively, sacrificial layers or sacrificial portions 28, tethers 94, and anchors 92 can be formed between the active electronic circuit 22 and the semiconductor wafer to form individual semiconductor substrates 20 and render the active electronic circuit 22 and electrode 32 assemblies micro-transfer printable. The compound filter or heterogeneous devices 10 of the present invention can then be micro-transfer printed as desired in a system.

U.S. patent application Ser. No. 14/743,981, filed Jun. 18, 2015, entitled Micro Assembled LED Displays and Lighting Elements, incorporated herein by reference describes micro-transfer printing structures and processes useful with the present invention. For a discussion of micro-transfer printing techniques see, U.S. Pat. Nos. 8,722,458, 7,622,367 and 8,506,867, each of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer or sacrificial portion 28 is considered "on" a substrate when a layer of sacrificial material or sacrificial portion 28 is on top of the substrate, when a portion of the substrate itself is the sacrificial layer 28, or when the sacrificial layer or sacrificial portion 28 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
10 compound acoustic wave filter device/heterogeneous device
12 acoustic wave filter wafer/source wafer
20 support substrate/semiconductor substrate/first substrate
21 support substrate area
22 active electronic circuit/first circuit
23 active electronic circuit area
24 circuit connection pad/first connection pad
25 semiconductor material
26 process side
28 sacrificial layer/sacrificial portion
29 handle wafer/source wafer
30 filter element/piezoelectric layer/piezoelectric filter/filter layer/filter substrate/second substrate
30A filter element
30B filter element
30C filter element
30D filter element
31 filter element area
32 electrode
34 filter connection pad/second connection pad
35 acoustic mirror layer
36 transducer/first transducer
38 second transducer
39 support wafer
40 electrical conductor
50 adhesive layer
52 dielectric layer
54 adhesive layer
60 acoustic wave
70 acoustic wave filter
70A acoustic wave filter
70B acoustic wave filter
70C acoustic wave filter
70D acoustic wave filter
78 surface-mount device
90 optional buffer layer
92 anchor
94 tether
100 provide substrate step
105 provide semiconductor substrate with electronic circuit step
110 form electronic circuit on semiconductor substrate step
120 provide source wafer step
125 provide acoustic filter on source wafer step
130 form acoustic filter on source wafer step
140 dispose adhesive material step
150 micro-transfer print acoustic filter on semiconductor substrate step
170 connect electronic circuit to filter circuit step
160 optional cure adhesive layer step
180 optional micro-transfer print integrated assembly step
200 provide support wafer step
202 provide source wafer/handle wafer step
205 optional form buffer layer step
210 form piezoelectric layer step
220 form electrode on piezoelectricl layer step
225 optional form acoustic mirror layer step
230 form patterned sacrificial layer step
240 form adhesive layer step
250 adhere semiconductor substrate to adhesive layer step
260 remove support wafer step
270 form electrode on piezoelectric layer step
275 optional form acoustic mirror layer step
280 etch patterned sacrificial layer step

What is claimed:

1. An acoustic wave filter source wafer, comprising:
a source wafer of substrate material;
a patterned sacrificial layer forming sacrificial portions on, over, or in the substrate material, a surface of the substrate material, the source wafer, or a surface of the source wafer, the sacrificial portions defining separate anchors between the sacrificial portions; and
a piezoelectric acoustic wave filter formed entirely over each sacrificial portion, the piezoelectric acoustic wave filter comprising (i) a layer of piezoelectric material and (ii) two or more electrodes in or on the piezoelectric material,
wherein a portion of the piezoelectric acoustic wave filter in contact with the sacrificial portion is chemically and selectively etch-resistant so that the contact portion has a chemical selectivity different from the patterned sacrificial layer and wherein the piezoelectric acoustic wave filter is attached to at least one of the separate anchors with at least one respective fracturable tether.

2. The acoustic wave filter source wafer of claim 1, wherein the contact portion is a portion of the layer of piezoelectric material or all of or a portion of an electrode.

3. The acoustic wave filter source wafer of claim 1, comprising one or more acoustic mirrors, each acoustic mirror disposed on a side of an electrode opposite the layer of piezoelectric material, and wherein the contact portion is an acoustic mirror.

4. The acoustic wave filter source wafer of claim 1, wherein the patterned sacrificial layer is a patterned layer of etchable material that can be removed to form a gap between the etch-resistant piezoelectric acoustic wave filter contact portion structure and the substrate material.

5. The acoustic wave filter source wafer of claim 1, wherein the two or more electrodes are formed on opposite sides of the piezoelectric acoustic wave filter and the piezoelectric acoustic wave filter is a bulk acoustic wave filter.

6. The acoustic wave filter source wafer of claim 1, wherein the piezoelectric acoustic wave filter has a width from 2 to 5 µm, 5 to 10 µm, 10 to 20 µm, or 20 to 50 µm, has a length from 2 to 5 µm, 5 to 10 µm, 10 to 20 µm, or 20 to 50 µm, or has a height from 2 to 5 µm, 4 to 10 µm, 10 to 20 µm, or 20 to 50 µm.

7. The acoustic wave filter source wafer of claim 1, wherein the piezoelectric acoustic wave filter is attached to the source wafer by only one fracturable tether.

8. An acoustic wave filter source wafer, comprising:
a source wafer of substrate material;
a patterned sacrificial layer forming sacrificial portions on, over, or in the substrate material, a surface of the substrate material, the source wafer, or a surface of the source wafer, the sacrificial portions defining separate anchors between the sacrificial portions; and
a piezoelectric acoustic wave filter formed entirely over each sacrificial portion, the piezoelectric acoustic wave filter comprising (i) a layer of piezoelectric material and (ii) two or more electrodes in or on the piezoelectric material,
wherein a portion of the piezoelectric acoustic wave filter in contact with the sacrificial portion is chemically and selectively etch-resistant so that the contact portion has a chemical selectivity different from the patterned sacrificial layer and wherein the piezoelectric acoustic wave filter is attached to at least one of the separate anchors with at least one respective fracturable tether, wherein the two or more electrodes are formed on a common side of the piezoelectric acoustic wave filter and the piezoelectric acoustic wave filter is a surface acoustic wave filter.

9. An acoustic wave filter source wafer, comprising:
a source wafer;
a plurality of piezoelectric acoustic wave filters each suspended over a respective gap by a respective fracturable tether connected to the source wafer, the piezoelectric acoustic wave filter comprising (i) a layer of piezoelectric material and (ii) two or more electrodes in or on the piezoelectric material.

10. The acoustic wave filter source wafer of claim 9, wherein each of the plurality of piezoelectric acoustic wave filters is suspended over the respective gap by only the respective fracturable tether.

* * * * *